(12) United States Patent
Abe et al.

(10) Patent No.: US 7,990,139 B2
(45) Date of Patent: Aug. 2, 2011

(54) TWO-AXIS GEO-MAGNETIC FIELD SENSOR WITH ELIMINATION OF EEFECT OF EXTERNAL OFFSET MAGNETIC FIELDS

(75) Inventors: Yasunori Abe, Mohka (JP); Tomoki Ono, Mohka (JP); Yuji Nihei, Mohka (JP)

(73) Assignee: Hitachi Metals, Ltd., Tokyo (JP)

( * ) Notice: Subject to any disclaimer, the term of this patent is extended or adjusted under 35 U.S.C. 154(b) by 25 days.

(21) Appl. No.: 12/063,393

(22) PCT Filed: Mar. 22, 2007

(86) PCT No.: PCT/JP2007/055795
§ 371 (c)(1),
(2), (4) Date: Feb. 8, 2008

(87) PCT Pub. No.: WO2007/132592
PCT Pub. Date: Nov. 22, 2007

(65) Prior Publication Data
US 2009/0108841 A1    Apr. 30, 2009

(30) Foreign Application Priority Data

May 17, 2006  (JP) .................................. 2006-137407
Jun. 20, 2006  (JP) .................................. 2006-169658

(51) Int. Cl.
*G01R 33/02*  (2006.01)
(52) U.S. Cl. ........................................ 324/252; 324/247
(58) Field of Classification Search .................. 324/247, 324/252, 207.12; 33/272, 316, 319, 352, 33/355 R, 356
See application file for complete search history.

(56) References Cited

U.S. PATENT DOCUMENTS

| 6,529,114 B1 | 3/2003 | Bohlinger et al. |
| 6,556,007 B1 | 4/2003 | Abe et al. |
| 6,707,298 B2 | 3/2004 | Suzuki et al. |
| 6,717,403 B2 | 4/2004 | Witcraft et al. |
| 7,138,798 B1 * | 11/2006 | Abe et al. ................. 324/252 |
| 2004/0111906 A1 * | 6/2004 | Abe et al. ................. 33/355 R |
| 2008/0054897 A1 * | 3/2008 | Crolly et al. ................. 324/252 |

FOREIGN PATENT DOCUMENTS

| JP | 2002-516999 A | 6/2002 |
| JP | 2002-310659 A | 10/2002 |
| JP | 2003-202365 A | 7/2003 |
| JP | 3573100 B2 | 7/2004 |
| JP | 2005-502888 A | 1/2005 |

* cited by examiner

*Primary Examiner* — Patrick J Assouad
*Assistant Examiner* — David M. Schindler
(74) *Attorney, Agent, or Firm* — Sughrue Mion, PLLC

(57) ABSTRACT

Disclosed is a small-sized two-axis magnetic field sensor having a function to cause a magnetic field canceling an external offset magnetic field. The two-axis magnetic field sensor contains a plane coil disposed on a plane and four sets of magneto-resistance element pairs on a plane parallel to the plane coil. The plane coil includes at least two pairs of parallel conductors, and two magneto-resistance elements cross only a single conductor of the coil. A current for canceling the external offset magnetic field is determined in advance, and while a DC current that causes total magnetic fields of biasing magnetic fields plus a magnetic field for canceling the external offset magnetic field flows through the coil, intermediate potential outputs from the magneto-resistance element pairs are detected to measure a magnetic field direction, such as geo-magnetism.

7 Claims, 6 Drawing Sheets

TWO-AXIS GEO-MAGNETIC FIELD SENSOR WITH ELIMINATION OF EEFECT OF EXTERNAL OFFSET MAGNETIC FIELDS

TECHNICAL FIELD

The present invention relates to a bearing sensor using magneto-resistance elements and, in particular, to a two-axis magnetic field sensor measuring a bearing while applying a biasing magnetic field to the magneto-resistance elements.

BACKGROUND ART

A magnetic field sensor measuring a bearing using magneto-resistance elements is disclosed in Patent Document 1. The magnetic field sensor is composed of an almost square plane coil formed on a plane substrate and four pairs of magneto-resistance elements crossing sides of the coil at a predetermined angle. By feeding a DC current to the plane coil, a reset magnetic field that magnetically saturates the magneto-resistance elements to a sufficient level and an appropriate magnetic field (biasing magnetic field) required upon measurement can be applied. In this case, the same amount of the reset or biasing magnetic field can be simultaneously applied in four directions: X direction; –X direction; Y direction; and –Y direction.

Patent Document 2 discloses two plane coils formed on plane substrates and a magnetic field sensing structure (which is a resistance bridge made of barber-pole type magneto-resistance elements in this case). A DC current is fed to a first plane coil to apply a reset magnetic field that magnetically saturates the barber-pole type magneto-resistance elements, while a DC current is being fed to a second plane coil to apply a magnetic field to cancel an external magnetic field to the barber-pole type magneto-resistance elements.

Patent Document 1: Japanese Patent 3,573,100 to which U.S. Pat. No. 6,556,007 issued Apr. 29, 2003 corresponds.

Patent Document 2: Published Japanese Translation 2005-502888 of a PCT application to which U.S. Pat. No. 6,717,403 issued Apr. 6, 2004 corresponds.

In determination of a bearing based on geo-magnetism measured by a magnetic field sensor, external magnetic fields other than the geo-magnetism are a cause of bearing errors. Detection of the bearing is made by measuring the geo-magnetism with two one-axis magnetic field sensors combined at a right angle with each other or a magnetic field sensor having two or more axes, calculating an angle between the reference direction of the magnetic field sensor and a vector of the geo-magnetism from the ratio between the measured values of each axis, and outputting the calculated angle as a bearing angle. If there are external magnetic fields other than the geo-magnetism upon the detection, the magnetic field measured by the magnetic field sensor results in a compound magnetic field of the geo-magnetism and the external magnetic fields, which means that the calculated angle is not an accurate bearing angle. Since the calculated bearing is offset from the actual bearing, the external magnetic field that causes the offset is referred to as an external offset magnetic field. Hereinafter, the term "external offset magnetic field" is used, unless otherwise specified.

Magnetic fields steadily or constantly existing in iron bridges, iron towers, ferro-concrete buildings and so on irrespective to the state of a magnetic field sensor appear to be external offset magnetic fields, however, these external magnetic fields are already included in a measured geo-magnetism, and therefore are not referred to as external offset magnetic fields. However, it is impossible to eliminate the influence of the external magnetic fields.

External offset magnetic fields are what are applied to a magnetic field sensor in the constant direction and at the constant intensity. For example, the external offset magnetic fields are caused by magnetic components on an electric circuit board on which the magnetic field sensor is installed, by a car body in which the magnetic field sensor is installed and so on. The influence of the external offset magnetic fields can be eliminated or reduced in a way.

Eliminating or reducing the influence of the external offset magnetic fields can be accomplished by measuring the external offset magnetic fields applied to the magnetic field sensor in advance and subtracting components of the external offset magnetic fields ahead of calculation of the ratio between measured magnetic field values of each axis. Another method includes applying a magnetic field for canceling the external offset magnetic fields around the magneto-resistance elements to eliminate the external offset magnetic fields.

DISCLOSURE OF THE INVENTION

Problems to be Solved by the Invention

The subtraction of the external offset magnetic field can be realized by a relatively simple calculation. However, highly sensitive magnetic field sensors, such as a bearing sensor, designed for measuring a weak magnetic field have poor accuracy in measuring the external offset magnetic field approximately 5 to 20 times larger than the geo-magnetism, which means that the highly sensitive magnetic field sensors cannot accurately measure the value of the external offset magnetic field. The inaccurate external offset magnetic field value used in the calculation leads to an inaccurate result of a bearing.

Application of a magnetic field capable of canceling the external offset magnetic field around the magneto-resistance elements helps the magnetic field sensor to detect a weak magnetic field, such as the geo-magnetism. Accordingly, the magnetic field sensor can be designed so as to be a highly sensitive sensor.

Although the single plane coil in Patent Document 1 can simultaneously apply the same amounts of reset magnetic fields or biasing magnetic fields in the four directions of –X direction, X direction, –Y direction and Y direction to the magneto-resistance elements, the coil cannot generate a magnetic field to cancel the external offset magnetic field, since the magnetic fields applied in an X axis and Y axis directions are the same in amount.

In Patent Document 2, a first plane coil for reset magnetic fields and a second plane coil for canceling external offset magnetic fields are provided. However, since the direction of the reset magnetic field and the direction of the magnetic field for canceling the external offset magnetic field are perpendicular to each other, the two plane coils must be arranged into a double layer structure, resulting in a complex structure of the magnetic sensor and an increase in the manufacturing process. Even though Patent Document 2 does not clearly mention, it is apparent that the magnetic field sensor in Patent Document 2 is a one-axis magnetic field sensor from the description that the direction of the reset magnetic field is oriented in the same direction as the magnetic field canceling the external offset magnetic field. When the one-axis magnetic field sensor is used as a bearing sensor, at least two magnetic field sensors need to be arranged so as to make their own measurement axes perpendicular to each other, resulting in a bearing sensor large in size.

An object of the present invention is to provide a two-axis magnetic field sensor with a function of causing a magnetic field to cancel an external magnetic field, in which a plane coil is used to apply a reset magnetic field and a biasing magnetic field to magneto-resistance elements, the plane coil can be constituted by a thin film so that the thickness of the sensor can be extremely thin and also the area of it can be small.

Means for Solving the Problems

A two-axis magnetic field sensor according to the present invention contains:
a plane coil including two first conductors parallel to each other and two second conductors perpendicular to the first conductors and parallel to each other; and
on a plane adjacent to the plane coil and parallel to the plane coil, a pair of first magneto-resistance elements, one of which has a longitudinal direction crossing only one of the two first conductors at an angle of 30° or more and less than 90°, and the other of which has a longitudinal direction crossing only the other of the two first conductors at an angle of 30° or more and less than 90°, and which longitudinal directions are not parallel to each other, and which ends are positioned between the two first conductors and connected to each other;
a pair of second magneto-resistance elements, one of which has a longitudinal direction crossing only the other of the two first conductors at an angle of 30° or more and less than 90°, and the other of which has a longitudinal direction crossing only the one of the two first conductors at an angle of 30° or more and less than 90°, and which longitudinal directions are not parallel to each other, and which ends are positioned between the two first conductors and connected to each other;
a pair of third magneto-resistance elements, one of which has a longitudinal direction crossing only one of the two second conductors at an angle of 30° or more and less than 90°, and the other of which has a longitudinal direction crossing only the other of the two second conductors at an angle of 30° or more and less than 90°, and which longitudinal directions are not parallel to each other, and which ends are positioned between the two second conductors and connected to each other; and
a pair of fourth magneto-resistance elements, one of which has a longitudinal direction crossing only the other of the two second conductors at an angle of 30° or more and less than 90°, and the other of which has a longitudinal direction crossing only the one of the two second conductors at an angle of 30° or more and less than 90°, and which longitudinal directions are not parallel to each other, and which ends are positioned between the two second conductors and connected to each other. The two-axis magnetic field sensor further contains a DC power source for making a current flow through the one of the two first conductors so as to apply a magnetic field to saturate the two magneto-resistance elements crossing the one of the two first conductors in a direction, making a current flow through the other of the two first conductors so as to apply a magnetic field to saturate the two magneto-resistance elements crossing the other of the two first conductors in a direction opposite to the saturation of the two magneto-resistance elements crossing the one of the two first conductors, making a current flow through the one of the two second conductors so as to apply a magnetic field to saturate the two magneto-resistance elements crossing the one of the two second conductors in a direction, making a current flow through the other of the two second conductors so as to apply a magnetic field to saturate the two magneto-resistance elements crossing the other of the two second conductors in a direction opposite to the saturation of the two magneto-resistance elements crossing the one of the two second conductors, and then making a current flow through each of the first conductors and the second conductors so as to apply to each of the magneto-resistance elements a total magnetic field of a certain amount of a biasing magnetic field in a direction opposite to the magnetic field applied to saturate each of the magneto-resistance elements plus a magnetic field canceling an external offset magnetic field. It further contains a measurement power source for applying a DC electric voltage for measurement between ends of the pair of the first magneto-resistance elements positioned outside the two first conductors, between ends of the pair of the second magneto-resistance elements positioned outside the two first conductors, between ends of the pair of the third magneto-resistance elements positioned outside the two second conductors, and between ends of the pair of the fourth magneto-resistance elements positioned outside the two second conductors. The sensor also contains a device for detecting a first intermediate potential output from the connected ends of the pair of the first magneto-resistance elements and a second intermediate potential output from the connected ends of the pair of the second magneto-resistance elements to get a first potential output difference between the first intermediate potential output and the second intermediate potential output, and detecting a third intermediate potential output from the connected ends of the pair of the third magneto-resistance elements and a fourth intermediate potential output from the connected ends of the pair of the fourth magneto-resistance elements to get a second potential output difference between the third intermediate potential output and the fourth intermediate potential output, while the DC electric voltage for measurement is applied to each pair of the magneto-resistance elements, and measuring a magnetic field direction from the first potential output difference and the second potential output difference.

In the two-axis magnetic field sensor according to the present invention, it is preferable that a longitudinal direction of each of the magneto-resistance elements crosses one of the conductors at an angle of 40° or more and less than 70°.

In the two-axis magnetic field sensor of the present invention, one of the two first conductors and the other of the two second conductors may constitute two sides of a right triangle plane coil and be connected in series with the DC power source, and one of the two second conductors and the other of the two first conductors may constitute two sides of another right triangle plane coil and be connected in series with the DC power source. Conductors on hypotenuses of the two right triangle plane coils may be disposed adjacent to each other.

In the two-axis magnetic field sensor of the present invention, one of the first conductors crossing one of the pair of the first magneto-resistance elements and the other of the pair of the second magneto-resistance elements, a part of the other of the second conductors crossing the other of the pair of the third magneto-resistance elements, and a part of the one of the second conductors crossing the other of the pair of the fourth magneto-resistance elements may constitute three sides of a rectangular plane coil and be connected to the DC power source,
the other of the first conductors crossing the other of the pair of the first magneto-resistance elements and the one of the pair of the second magneto-resistance elements, a part of the one of the second conductors crossing the one of the pair of the third magneto-resistance elements, and a part of the other of the second conductors crossing the one of the pair of the fourth magneto-resistance elements may constitute three sides of another rectangular plane coil and be connected to the DC power source, and conductors on remaining sides of the two rectangular plane coils may be disposed adjacent to each other.

ADVANTAGES OF THE INVENTION

In the present invention, the plane coil in plural shapes of almost right isosceles triangles or an almost rectangular shape is formed on a single plane so that the two-axis magnetic field sensor can measure a magnetic field, such as geo-magnetism, by applying a biasing magnetic field and simultaneously canceling an external offset magnetic field, after applying a reset magnetic field to the magneto-resistance elements. Also, because of the plane coil formed on a single plane, a magnetic field sensor with a simple small-sized structure can be provided for a low price. Furthermore, the two-axis magnetic field sensor according to the present invention can be applied for a bearing sensor, a current sensor, and other sensors for a weak magnetic field.

Figure 1:
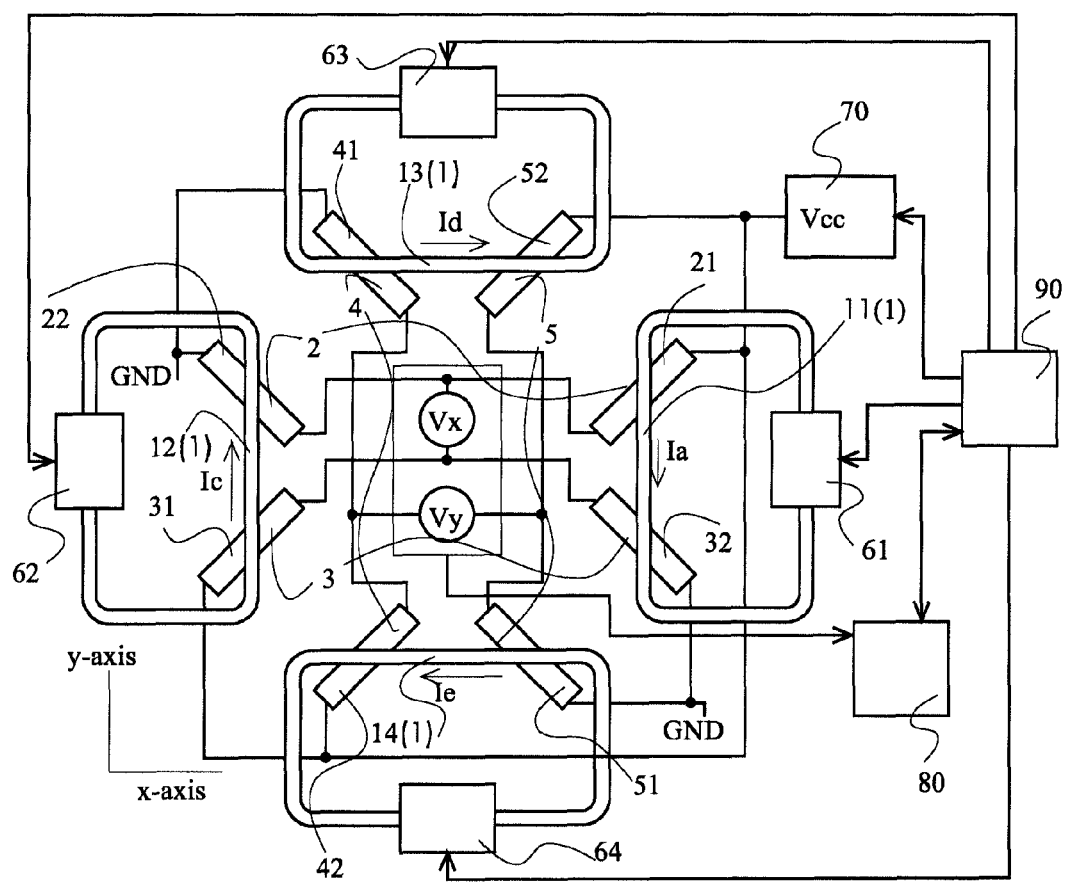
FIG. 1 is a schematic diagram showing a two-axis magnetic field sensor of EXAMPLE 1 according to the present invention.

EXPLANATION OF REFERENCE NUMERALS 1, 1a, 1b, 1c: plane coil
1a', 1a", 1b', 1b": right isosceles triangle plane coil
1c', 1c": rectangular plane coil
11, 12: first conductor
13, 14: second conductor
2, 3, 4, 5: magneto-resistance element pair
21, 22, 31, 32, 41, 42, 51, 52: magneto-resistance element
61, 62, 63, 64: DC power source
70: measurement power source
80: device for measuring a magnetic field direction
90: controller

BEST MODE FOR CARRYING OUT OF THE INVENTION

With reference to the drawings, detailed descriptions will be made about the present invention with examples below.

For the sake of clarity, the same components and parts are denoted by the same reference numerals.

Example 1

FIG. 1 is a schematic diagram of a two-axis magnetic field sensor of EXAMPLE 1 according to the present invention. The two-axis magnetic field sensor in EXAMPLE 1 has a plane coil 1 and four pairs of magneto-resistance elements 2, 3, 4, 5 provided on a plane adjacent to the plane coil and parallel to the plane coil. The plane coil 1 is composed of two first conductors 11, 12 parallel to each other and two second conductors 13, 14 that are perpendicular to the first conductors 11, 12 and parallel to each other. The four pairs of the magneto-resistance elements are composed of a pair of first magneto-resistance elements 2, a pair of second magneto-resistance elements 3, a pair of third magneto-resistance elements 4, and a pair of fourth magneto-resistance elements 5. The pair of the first magneto-resistance elements 2 includes a magneto-resistance element 21 having a longitudinal direction crossing only one of the two first conductors 11, 12 (e.g. the first conductor 11) and a magneto-resistance element 22 having a longitudinal direction crossing only the other of the two first conductors (e.g. the first conductor 12), and the longitudinal directions of these magneto-resistance elements 21, 22 are not parallel to each other. The pair of the second magneto-resistance elements 3 includes a magneto-resistance element 31 having a longitudinal direction crossing only the other of the two first conductors 11, 12 (e.g. the first conductor 12) and a magneto-resistance element 32 having a longitudinal direction crossing only the one of the two first conductors (e.g. the first conductor 11), and the longitudinal directions of these magneto-resistance elements 31, 32 are not parallel to each other. The pair of the third magneto-resistance elements 4 includes a magneto-resistance element 41 having a longitudinal direction crossing only one of the two second conductors 13, 14 (e.g. the second conductor 13) and a magneto-resistance element 42 having a longitudinal direction crossing only the other of the two second conductors (e.g. the second conductor 14), and the longitudinal directions of these magneto-resistance elements 41, 42 are not parallel to each other. The pair of the fourth magneto-resistance elements 5 includes a magneto-resistance element 51 having a longitudinal direction crossing only the other of the two second conductors 13, 14 (e.g. the second conductor 14) and a magneto-resistance element 52 having a longitudinal direction crossing only the one of the two second conductors (e.g. the second conductor 13), and the longitudinal directions of these magneto-resistance elements 51, 52 are not parallel to each other. The longitudinal direction of each of the magneto-resistance elements crosses the conductors at an angle of 30° or more and less than 90°, preferably at an angle of 40° or more and less than 70°, and at an angle of 45° shown in FIG. 1. The longitudinal directions of each pair of the magneto-resistance elements form a right angle.

Each of the magneto-resistance elements 21, 22 in the pair of the first magneto-resistance elements 2 has an end between the two parallel first conductors 11 and 12, and the ends of the magneto-resistance elements 21, 22 are connected to each other. Each of the magneto-resistance elements 31, 32 in the pair of the second magneto-resistance elements 3 has an end between the two parallel first conductors 11 and 12, and the ends of the magneto-resistance elements 31, 32 are connected to each other. Each of the magneto-resistance elements 41, 42 in the pair of the third magneto-resistance elements 4 has an end between the two parallel second conductors 13 and 14, and the ends of the magneto-resistance elements 41, 42 are connected to each other. Each of the magneto-resistance elements 51, 52 in the pair of the fourth magneto-resistance elements 5 has an end between the two parallel second conductors 13 and 14, and the ends of the magneto-resistance elements 51, 52 are connected to each other. In addition, the longitudinal directions of the two magneto-resistance elements 21 and 32, which cross one of the first conductors 11, 12, are not parallel to each other and form a right angle shown in FIG. 1. The longitudinal directions of the two magneto-resistance elements 31 and 22, which cross the other of the first conductors 11, 12, are not parallel to each other and form a right angle shown in FIG. 1. The longitudinal directions of the two magneto-resistance elements 41 and 52, which cross one of the second conductors 13, 14, are not parallel to each other and form a right angle shown in FIG. 1. The longitudinal directions of the two magneto-resistance elements 51 and 42, which cross the other of the second conductors 13, 14, are not parallel to each other and form a right angle shown in FIG. 1.

One of the two first conductors 11, 12 of the plane coil 1 is connected to a DC power source 61, while the other is connected to a DC power source 62. One of the two second conductors 13, 14 is connected to a DC power source 63, while the other is connected to a DC power source 64. Each of the first and second conductors 11, 12, 13, 14 is composed of several tens of parallel conductors. When a DC current is fed from each of the DC power sources 61, 62, 63, 64 to the first conductors 11, 12 and second conductors 13, 14, respectively, so that the DC current flows in the conductors 11, 12, 13, 14 clockwise or counterclockwise, these conductors act as the plane coil 1 and generate DC magnetic fields oriented from the inside of the coil to the outside or from the outside of the coil to the inside on the plane in which the four pairs of the magneto-resistance elements are provided, and then the DC magnetic fields are applied to the magneto-resistance elements 21 to 52. Now, consideration will be given to orthogonal coordinates where the direction along which the two second conductors 13, 14 of the plane coil in FIG. 1 extend is X axis and the direction along which the two first conductors 11, 12 extend is Y axis. When currents Ia, Ic, Id, Ie are fed to flow in the plane coil 1 clockwise, an X-direction magnetic field, a −X-direction magnetic field, a Y-direction magnetic field and a −Y-direction magnetic field are applied to the magneto-resistance elements 21, 32, magneto-resistance elements 22, 31, magneto-resistance elements 41, 52 and magneto-resistance elements 42, 51, respectively. When currents −Ia, −Ic, −Id, −Ie are fed to flow in the plane coil 1 counterclockwise, magnetic fields opposite to the above mentioned magnetic field directions are applied to the magneto-resistance elements, respectively.

The DC power source 61 feeds the first conductor 11, which is one of the first conductors, with a DC current (reset DC current) enough to generate a DC magnetic field (reset DC magnetic field) enough to saturate the two magneto-resistance elements 21, 32, which cross the first conductor 11, in a direction perpendicular to the longitudinal directions of the magneto-resistance elements 21, 32. Subsequently, the DC power source 61 feeds a DC current to the first conductor 11 to apply to the magneto-resistance elements 21, 32 with a total magnetic field of a certain amount of a biasing magnetic field opposite to the reset DC magnetic field plus a DC magnetic field enough to cancel an external offset magnetic field. The DC power source 62 feeds the first conductor 12, which is the other of the first conductors, with a DC current (reset DC current) enough to generate a DC magnetic field (reset DC magnetic field), in the counter direction to the reset DC current flowing in the first conductor 11, enough to saturate the two magneto-resistance elements 31, 22, which cross the first conductor 12, in a direction perpendicular to the longitudinal directions of the magneto-resistance elements 31, 22. Subsequently, the DC power source 62 feeds a DC current to the first conductor 12 to apply to the magneto-resistance elements 31, 22 with a total magnetic field of a certain amount of a biasing magnetic field opposite to the reset DC magnetic field of the first conductor 12 plus a DC magnetic field enough to cancel the external offset magnetic field. The reset DC current in the one first conductor 11 and the reset DC current in the other first conductor 12 flow in the opposite direction to each other. The saturation magnetic fields to be applied to the magneto-resistance elements crossing each of the first conductors are oriented in the opposite directions to each other. In short, the reset DC current is fed to each of the first conductors so that the reset DC magnetic fields are oriented from the inside of the two first conductors to the outside or from the outside to the inside.

The DC power source 63 feeds the second conductor 13, which is one of the second conductors, with a DC current (reset DC current) enough to generate a DC magnetic field (reset DC magnetic field) enough to saturate the two magneto-resistance elements 41, 52, which cross the second conductor 13, in a direction perpendicular to the longitudinal directions of the magneto-resistance elements 41, 52. Subsequently, the DC power source 63 feeds a DC current to the second conductor 13 to apply to the magneto-resistance elements 41, 52 with a total magnetic field of a certain amount of a biasing magnetic field opposite to the reset DC magnetic fields plus a DC magnetic field enough to cancel the external offset magnetic field. The reset DC current flowing through the second conductor 13 is in such a direction that the magnetic fields due to the reset DC current are oriented from the inside of the two second conductors 13, 14 to the outside when the magnetic fields that are generated by the reset DC current flowing in the two first conductors 11, 12 are oriented from the inside of the two first conductors 11, 12 to the outside. The DC power source 64 feeds the second conductor 14, which is the other of the second conductors, with a DC current (reset DC current), in the counter direction to the reset DC current flowing in the second conductor 13, enough to generate a DC magnetic field (reset DC magnetic field) enough to saturate the two magneto-resistance elements 51, 42, which cross the second conductor 14, in a direction perpendicular to the longitudinal directions of the magneto-resistance elements 51, 42. Subsequently, the DC power source 64 feeds a DC current to the second conductor 14 to apply to the magneto-resistance elements 51, 42 with total magnetic fields of certain amounts of biasing magnetic fields opposite to the reset DC magnetic fields of the second conductor 14 plus a DC magnetic field enough to cancel the external offset magnetic field. The reset DC current in the one second conductor 13 and the reset DC current in the other second conductor 14 flow in the opposite directions to each other. The saturation magnetic fields to be applied to the magneto-resistance elements crossing each of the second conductors are oriented in the opposite directions to each other. In short, the reset DC current is fed to each of the second conductors so that the reset DC magnetic fields are oriented from the inside of the two second conductors to the outside or from the outside to the inside.

After the reset DC magnetic fields oriented from the inside of the plane coil 1 to the outside or from the outside to the inside are simultaneously applied to the magneto-resistance elements 21, 32, 31, 22, 41, 52, 51 and 42 by means of the DC power sources 61, 62, 63 and 64, the reset DC magnetic fields are reducing in absolute values, and then a DC current is fed to the plane coil 1 to apply to each of the magneto-resistance elements with a total magnetic field of a certain amount of a biasing DC magnetic field opposite to the reset DC magnetic fields plus a DC magnetic field enough to cancel the external offset magnetic field. Subsequently, after reset DC magnetic fields opposite to the previously applied reset DC magnetic fields are simultaneously applied to the magneto-resistance elements 21, 32, 31, 22, 41, 52, 51 and 42 by means of the DC power sources 61, 62, 63 and 64, the reset DC magnetic fields are reducing in absolute values, and then a DC current is fed to the plane coil 1 to apply to each of the magneto-resistance elements with a total magnetic field of a certain amount of the biasing DC magnetic field opposite to the reset DC magnetic fields plus a DC magnetic field enough to cancel the external offset magnetic field.

The two-axis magnetic field sensor of the present invention further contains a measurement power source 70 for applying a DC electric voltage for measurement Vcc between ends of the pair of the first magneto-resistance elements 2 positioned outside the two first conductors 11, 12, between ends of the pair of the second magneto-resistance elements 3 positioned outside the two first conductors 11, 12, between ends of the pair of the third magneto-resistance elements 4 positioned outside the two second conductors 13, 14, and between ends of the pair of the fourth magneto-resistance elements 5 positioned outside the two second conductors 13, 14.

The two-axis magnetic field sensor of the present invention further contains a device for measuring a magnetic field direction 80. While the measurement power source 70 is applying the DC electric voltage for measurement Vcc to each pair of the magneto-resistance elements 2, 3, 4, 5, and while the total magnetic fields of the biasing magnetic fields plus the DC magnetic field enough to cancel the external offset magnetic field are applied by the plane coil 1 energized by the DC power sources 61, 62, 63, 64 to each of the magneto-resistance elements, the device for measuring the magnetic field direction 80 detects a first intermediate potential output from the connected ends of the pair of first magneto-resistance elements 2 and a second intermediate potential output from the connected ends of the pair of the second magneto-resistance elements 3 to get a first potential output difference between the first intermediate potential output and the second intermediate potential output. And, the device for measuring the magnetic field direction 80 also detects a third intermediate potential output from the connected ends of the pair of the third magneto-resistance elements 4 and a fourth intermediate potential output from the connected ends of the pair of the fourth magneto-resistance elements 5 to get a second potential output difference between the third intermediate potential output and the fourth intermediate potential output. And then, the device for measuring a magnetic field direction 80 obtains a magnetic field direction from the first potential output difference and the second potential output difference. Alternatively, a first potential output difference and a second potential output difference are obtained after a reset magnetic field oriented from the inside of the plane coil 1 to the outside or from the outside to the inside is applied to each of the magneto-resistance elements. After that, another first potential output difference and another second potential output difference are obtained after a reset magnetic field opposite to the previously applied reset magnetic field is applied to each of the magneto-resistance elements. And then, a magnetic field direction may be obtained, using the two first potential output differences and the two second potential output differences.

A controller 90 may control each of the DC power sources 61, 62, 63, 64 so as to feed positive and negative reset DC currents and DC currents to the conductors 11, 12, 13, 14 to generate the total magnetic fields of the biasing magnetic fields plus the magnetic field canceling the external offset magnetic field. The controller 90 determines the offset current (Ioffx, Ioffy) corresponding to the magnetic field canceling the external offset magnetic field in advance and memorizes the offset current to control the amount of the DC current to be fed from each DC power source to each conductor. The determination of the offset current corresponding to the magnetic field canceling the external offset magnetic field is made as will be described later: the two-axis magnetic field sensor is placed on any three points on an arc; a reset current is fed from each DC power source to each conductor; a current that is required to make the difference of the intermediate potential outputs of the magneto-resistance element pair zero is fed to each conductor; and the currents denote reset currents (Ioffxa, Ioffya), (Ioffxb, Ioffyb), (Ioffxc, Ioffyc) at the three points. The reset currents at the three points are used to determine the offset current (Ioffx, Ioffy) corresponding to the magnetic field canceling the external offset magnetic field.

Figure 9:
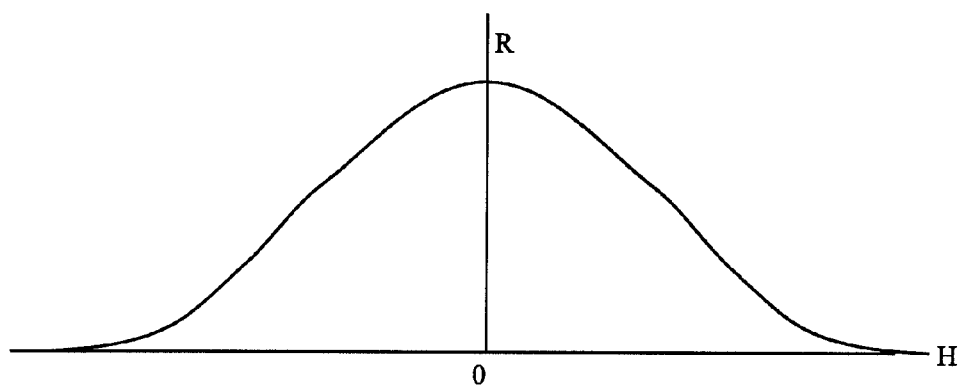
FIG. 9 is a general graph showing a relationship between resistance and an applied magnetic field.
Figure 10:
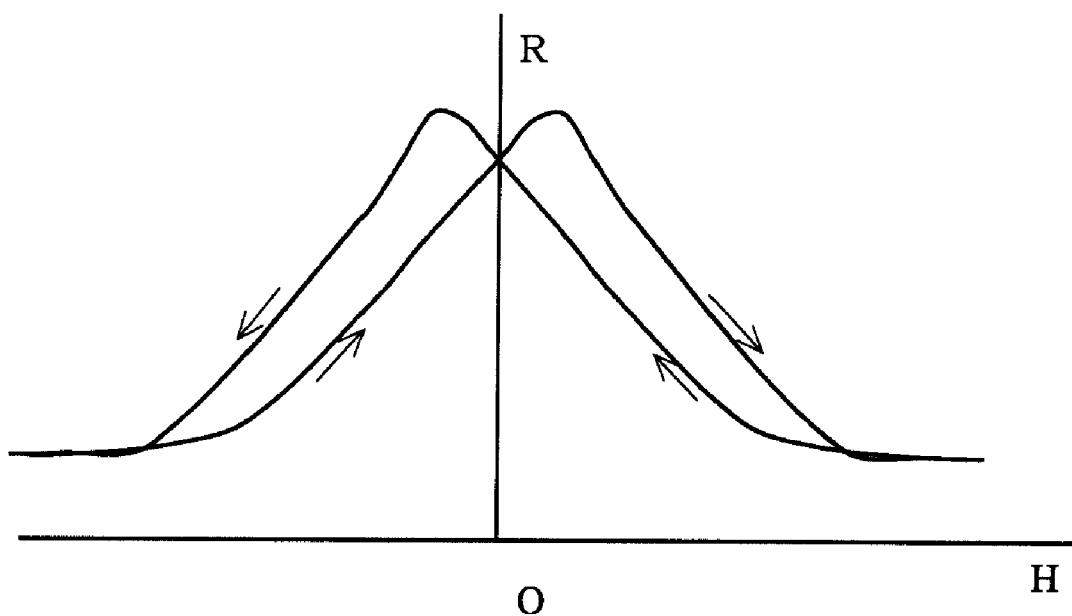
FIG. 10 is a graph showing a hysteresis in resistance with respect to an applied magnetic field.

When a magnetic field H is applied to the magneto-resistance elements in directions perpendicular to their longitudinal directions on the plane where the magneto-resistance elements are provided, the resistance R of the magneto-resistance elements to the currents flowing in the magneto-resistance elements in their longitudinal directions decreases according to the amount of the applied magnetic field as shown in FIG. 9, and hysteresis is generated between the resistance R and the magnetic field H according to the orientation in which the magnetic field increases and decreases as shown in FIG. 10.

Figure 2:
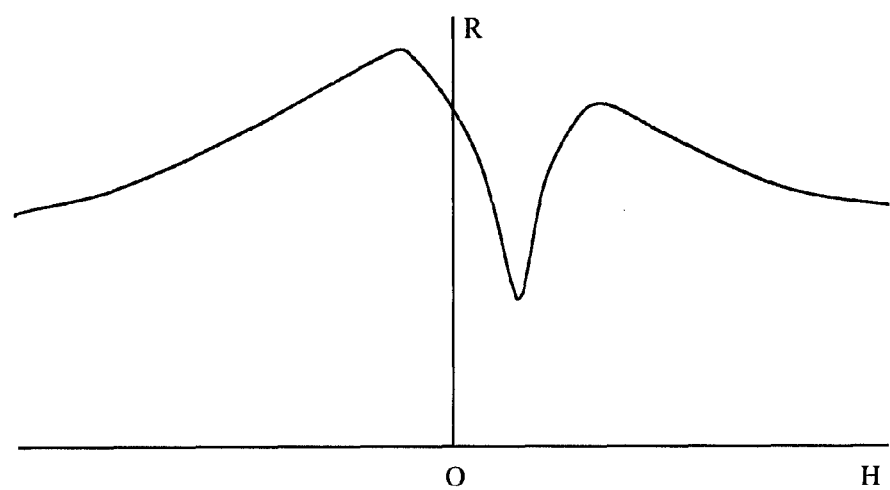
FIG. 2 is a graph showing a relationship between resistance and an applied magnetic field.

To a magneto-resistance element crossing a side of the plane coil at 45°, an external magnetic field is applied in the direction of 45° with respect to the direction perpendicular to the longitudinal direction of the magneto-resistance element. In this case, since the magneto-resistance element has magnetic shape anisotropy in its longitudinal direction, the magneto-resistance element is resultingly applied with a compound vector of the magnetic shape anisotropic magnetic field and the external magnetic field. Accordingly, the relationship between the external magnetic field H and the resistance R when the external magnetic field is applied to the magneto-resistance element is established as shown in the graph of FIG. 2. FIG. 2 shows changes in the resistance R when the magneto-resistance elements are applied with a great amount of the magnetic field H oriented in the negative direction, and then the magnetic field H is gradually increased in the positive direction. Since the magneto-resistance element has a minimum resistance when a certain amount of a positive magnetic field is applied, the rate of change of the resistance with respect to the changes of the applied magnetic field reaches the maximum when the certain amount of the positive magnetic field is applied. A graph, indicating the relationship between the resistance and the magnetic field when the magneto-resistance element is applied with a great amount of the magnetic field oriented in the positive direction, and then the applied magnetic field is gradually reduced, will be symmetric with the graph in FIG. 2 with respect to the line of the magnetic field 0.

The magnitude of the horizontal component of the geo-magnetism is denoted by He, while the angle at which the horizontal component of the geo-magnetism He is formed with the X axis is denoted by θ. Uniform magnetic fields applied to the two-axis magnetic field sensor other than the geo-magnetism are collectively referred to as an external offset magnetic field. Measurement of the geo-magnetism direction will be described where the X-axis component of the external offset magnetic field is Hoffx and the Y-axis component is Hoffy. First, measurement of the magnetic field of the X axis is described. A magnetic field H21 to be applied to the magneto-resistance element 21 is the sum of a magnetic field generated by a current Ia flowing in the one first conductor 11, which is one of the first conductors, of the plane coil 1, plus the X-axis component Hoffx of the external offset magnetic field plus the X-axis component of the horizontal component He of the geo-magnetism, and is given by $$H21 = \gamma \cdot Ia + Hoffx + He \cdot \cos \theta,$$

where γ is a constant determined by the shape of the first conductor 11 and the distance between the plane coil 1 and the plane in which the magneto-resistance element is provided.

The current Ia flowing in the first conductor 11 clockwise in FIG. 1 is set to the sum of a biasing current Ib to apply a biasing magnetic field that is most suitable for the two-axis magnetic field sensor to detect magnetic fields to the magneto-resistance elements plus a current −Ioffx that applies a magnetic field canceling the X-axis component Hoffx of the external offset magnetic field to the magneto-resistance element 21, and is given by:

$$Ia = Ib - Ioffx.$$

Figure 3:
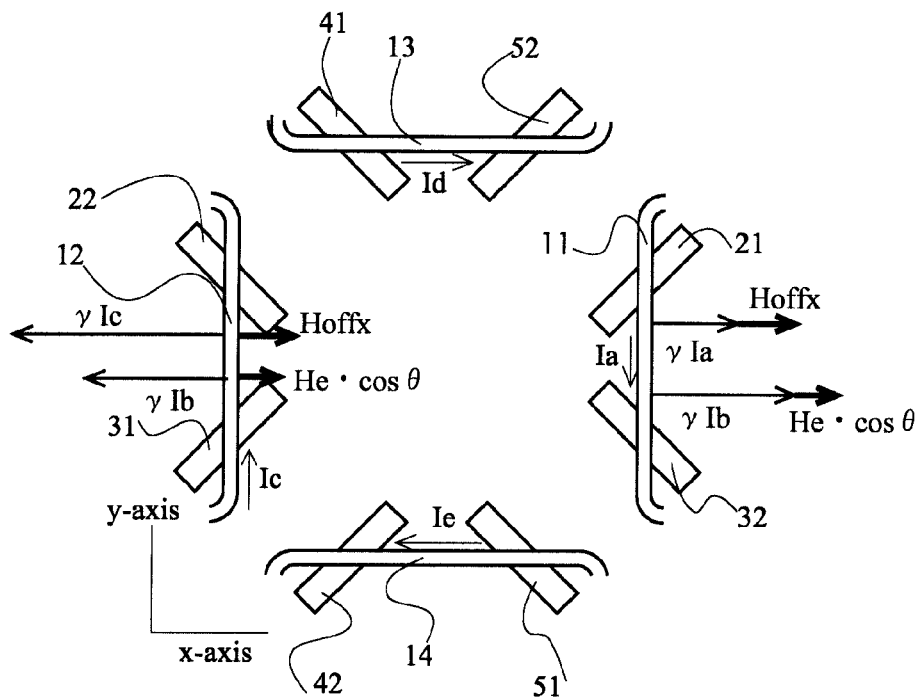
FIG. 3 is an explanatory view of an applied magnetic field in EXAMPLE 1 according to the present invention.

FIG. 3 shows the magnetic field around the magneto-resistance elements in this condition. The magnetic field H21 applied to the magneto-resistance element 21 is given by the following formula.

$$H21 = \gamma \cdot Ia + Hoffx + He \cdot \cos \theta$$

$$= \gamma \cdot (Ib - Ioffx) + Hoffx + He \cdot \cos \theta$$

Since −Ioffx is the current for canceling the X-axis component Hoffx of the external offset magnetic field, $$Hoffx = \gamma \cdot Ioffx$$

is established, and the magnetic field H21 is given by:

$$H21 = \gamma \cdot Ib + He \cdot \cos \theta.$$

Figure 4:
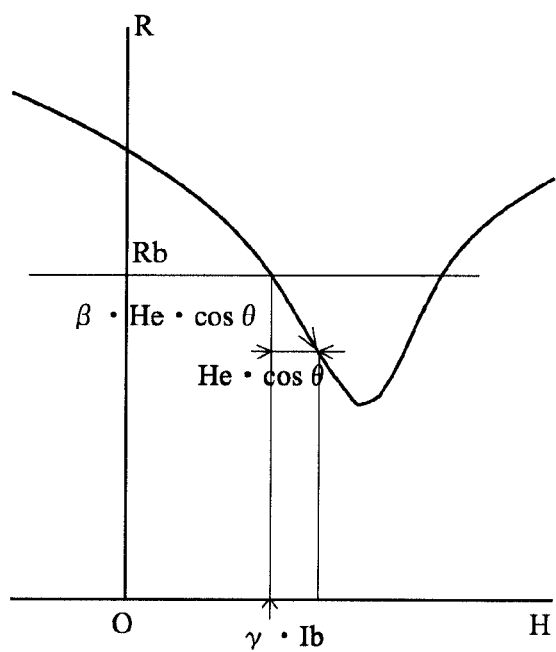
FIG. 4 is a partially enlarged graph of the graph shown in FIG. 2.

FIG. 4 is an enlarged view of a characterizing part of the graph in FIG. 2. The resistance of the magneto-resistance element 21 to which only the biasing DC magnetic field γ·Ib is applied is represented by Rb. Letting β be a rate of change in resistance to magnetic field, if the X-axis component He·cos θ of the geo-magnetism is added to the biasing DC magnetic field, the resistance of the magneto-resistance element 21 is decreased by β·He·cos θ, and therefore the resistance R21 of the magneto-resistance element 21 is given by:

$$R21 = Rb - \beta \cdot He \cdot \cos \theta.$$

The current Ic flowing in the other first conductor 12, which is the other of the first conductors, clockwise in FIG. 1 is the sum of a biasing current Ib to apply an optimal biasing magnetic field plus a current Ioffx that applies a magnetic field canceling the X-axis component Hoffx of the external offset magnetic field to the magneto-resistance element 22, and is given by:

$$Ic = Ib + Ioffx.$$

FIG. 3 shows the magnetic field around the magneto-resistance elements in this condition. The magnetic field H22 to be applied to the magneto-resistance element 22 is given by the following formula.

$$H22 = \gamma \cdot Ic + Hoffx + He \cdot \cos \theta$$

$$= \gamma \cdot (Ib + Ioffx) + Hoffx + He \cdot \cos \theta$$

$$= -\gamma \cdot Ib + He \cdot \cos \theta.$$

The property of the resistance R 22 of the magneto-resistance element 22 in this condition is represented by a graph symmetric with the graphs of FIG. 2 and FIG. 4, and therefore the resistance R22 is given by:

$$R22 = Rb + \beta \cdot He \cdot \cos \theta.$$

Consequently, the intermediate potential output Vco2(+) between the magneto-resistance element 21 and the magneto-resistance element 22 in the pair of the first magneto-resistance elements 2 is given by:

$$Vco2(+) = Vcc \cdot \{1/2 - 1/(2 \cdot Rb) \cdot \beta \cdot He \cdot \cos \theta\}.$$

The resistance R32 of the magneto-resistance element 32 in the pair of the second magneto-resistance elements 3 is equal to the resistance R21 of the magneto-resistance element 21, while the resistance R31 of the magneto-resistance element 31 is equal to the resistance R22 of the magneto-resistance element 22. Accordingly, the intermediate potential output Vco3(+) between the magneto-resistance element 31 and the magneto-resistance element 32 in the second magneto-resistance element pair 3 is given by:

$$Vco3(+) = Vcc \cdot \{1/2 - 1/(2 \cdot Rb) \cdot \beta \cdot He \cdot \cos \theta\}.$$

Since the difference between the intermediate potential output at the connected ends of the first magneto-resistance element pair 2 and that at the connected ends of the second magneto-resistance element pair 3 is taken out as Vx in FIG. 1, the intermediate potential output difference Vx(+) is given by:

$$Vx(+) = Vco2(+) - Vco3(+)$$

$$= Vcc \cdot [\{1/2 + 1/(2 \cdot Rb) \cdot \beta \cdot He \cdot \cos \theta\} - \{1/2 - 1/(2 \cdot Rb) \cdot \beta \cdot He \cdot \cos \theta\}]$$

$$= Vcc \cdot 1/Rb \cdot \beta \cdot He \cdot \cos \theta.$$

Next, DC currents are fed to flow in the two first conductors 11, 12 in the opposite directions to the above-mentioned directions to apply to the magneto-resistance elements 21, 22, 31, 32 DC magnetic fields enough to saturate the magneto-resistance elements 21, 22, 31, 32 in the directions perpendicular to their longitudinal directions. Subsequently, while certain amounts of DC currents are fed to flow in the two first conductors 11, 12 in the opposite directions to the DC currents to apply total magnetic fields of biasing DC magnetic fields plus a magnetic field canceling the external offset magnetic field in the directions perpendicular to the longitudinal directions of the magneto-resistance elements, as with the above-mentioned case, a DC electric voltage for measurement Vcc is applied between ends of the pair of the first magneto-resistance elements, and the intermediate potential outputs are taken out from the connected ends. The current Ia' fed to the one first conductor 11 herein is the sum of an optimal biasing current −Ib plus a current −Ioffx to apply a magnetic field canceling the X-axis component Hoffx of the external offset magnetic field to the magneto-resistance element 21, and the current Ia' is given by:

$$Ia' = -Ib - Ioffx.$$

The magnetic field H21' to be applied to the magneto-resistance element 21 in this condition is given by:

$$H21' = \gamma \cdot Ia' + Hoffx + He \cdot \cos \theta$$

$$= \gamma \cdot (Ib + Ioffx) + Hoffx + He \cdot \cos \theta$$

$$= -\gamma \cdot Ib + He \cdot \cos \theta.$$

The resistance R21' of the magneto-resistance element 21 in this condition is given by:

$$R21'=Rb+\beta \cdot He \cdot \cos\theta.$$

The current Ic' to be fed to the other first conductor 12 is the sum of an optimal biasing current −Ib plus a current Ioffx that applies a magnetic field canceling the X-axis component Hoffx of the external offset magnetic field to the magneto-resistance element 22 and is given by:

$$Ic'=-Ib+Ioffx.$$

The magnetic field H22' to be applied to the magneto-resistance element 22 in this condition is given by:

$$H22'=-\gamma \cdot Ic'+Hoffx+He \cdot \cos\theta$$

$$=-\gamma \cdot (-Ib+Ioffx)+Hoffx+He \cdot \cos\theta$$

$$=\gamma \cdot Ib+He \cdot \cos\theta.$$

The resistance R22' of the magneto-resistance element 22 in this condition is given by:

$$R22'=Rb-\beta \cdot He \cdot \cos\theta.$$

The intermediate potential output Vco2(−) between the magneto-resistance element 21 and the magneto-resistance element 22 in the pair of the first magneto-resistance elements 2 is given by:

$$Vco2(-)=Vcc \cdot \{1/2-1/(2 \cdot Rb) \cdot \beta \cdot He \cdot \cos\theta\}.$$

Similarly, the intermediate potential output Vco3(−) between the magneto-resistance element 31 and the magneto-resistance element 32 in the pair of the second magneto-resistance elements 3 is given by:

$$Vco3(-)=Vcc \cdot \{1/2+1/(2 \cdot Rb) \cdot \beta \cdot He \cdot \cos\theta\}.$$

The intermediate potential output difference Vx(−) between the first magneto-resistance element pair 2 and the second magneto-resistance element pair 3 is given by:

$$Vx(-)=Vco2(-)-Vco3(-)$$

$$=Vcc \cdot [\{1/2-1/(2 \cdot Rb) \cdot \beta \cdot He \cdot \cos\theta\}-\{1/2+1/(2 \cdot Rb) \cdot \beta \cdot He \cdot \cos\theta\}]$$

$$=-Vcc \cdot 1/Rb \cdot \beta \cdot He \cdot \cos\theta.$$

The difference Vx between the intermediate potential output differences can be obtained by:

$$Vx=Vx(+)-Vx(-)$$

$$=2Vcc \cdot 1/Rb \cdot \beta \cdot He \cdot \cos\theta.$$

From the above formula, the output value Vx of the X axis is not varied by the X-axis component Hoffx of the external offset magnetic field.

Next, measurement of the magnetic field of Y axis will be described. DC currents are fed to flow in the two second conductors 13, 14 counterclockwise in FIG. 1 to apply to the magneto-resistance elements 41, 42, 51, 52 a DC magnetic field enough to saturate the magneto-resistance elements 41, 42, 51, 52 in the directions perpendicular to their longitudinal directions. Subsequently, while certain amounts of DC currents are fed to flow in the two second conductors 13, 14 in the opposite directions to the above DC currents to apply total magnetic fields of biasing DC magnetic fields plus a magnetic field canceling the external offset magnetic field to the magneto-resistance elements in the directions perpendicular to their longitudinal directions, as with the above case, a DC electric voltage for measurement Vcc is applied between ends of the magneto-resistance element pairs, and intermediate potential outputs are taken out from the connected ends. The current Id to be fed to the one second conductor 13 is the sum of an optimal biasing current Ib plus a current −Ioffy that applies a magnetic field canceling the Y-axis component Hoffy of the external offset magnetic field to the magneto-resistance element 41, and is given by:

$$Id=Ib-Ioffy.$$

The magnetic field H41 to be applied to the magneto-resistance element 41 in this condition is given by:

$$H41=\gamma \cdot Id+Hoffy+He \cdot \sin\theta$$

$$=\gamma \cdot (Ib-Ioffy)+Hoffy+He \cdot \sin\theta$$

$$=\gamma \cdot Ib+He \cdot \sin\theta.$$

The resistance R41 of the magneto-resistance element 41 in this condition is given by:

$$R41=Rb-\beta \cdot He \cdot \sin\theta.$$

The current Ie to be fed to flow in the other second conductor 14 clockwise in FIG. 1 is the sum of an optimal biasing current Ib plus a current Ioffy that applies a magnetic field canceling the Y-axis component Hoffy of the external offset magnetic field to the magneto-resistance element 42, and is given by:

$$Ie=Ib+Ioffy.$$

The magnetic field H42 to be applied to the magneto-resistance element 42 in this condition is given by:

$$H42=-\gamma \cdot Ie+Hoffy+He \cdot \sin\theta$$

$$=-\gamma \cdot (Ib+Ioffy)+Hoffy+He \cdot \sin\theta$$

$$=-\gamma \cdot Ib+He \cdot \sin\theta.$$

The resistance R42 of the magneto-resistance element 42 in this condition is given by:

$$R42=Rb+\beta \cdot He \cdot \sin\theta.$$

Accordingly, the intermediate potential output Vco4(+) between the magneto-resistance element 41 and the magneto-resistance element 42 in the pair of the third magneto-resistance elements 4 can be obtained by:

$$Vco4(+)=Vcc \cdot \{1/2+1/(2 \cdot Rb) \cdot \beta \cdot He \cdot \sin\theta\}.$$

The resistance R52 of the magneto-resistance element 52 in the pair of the fourth magneto-resistance elements 5 is equal to the resistance R41 of the magneto-resistance element 41, while the resistance R51 of the magneto-resistance element 51 is equal to the resistance R42 of the magneto-resistance element 42. Accordingly, the intermediate potential output Vco5(+) between the magneto-resistance element 51 and the magneto-resistance element 52 in the fourth magneto-resistance element pair 5 is given by:

$$Vco5(+)=Vcc \cdot \{1/2-1/(2 \cdot Rb) \cdot \beta \cdot He \cdot \sin\theta\}.$$

Since the difference between the intermediate potential output at the connected ends of the third magneto-resistance element pair 4 and that at the connected ends of the fourth magneto-resistance element pair 5 is taken out as Vy in FIG. 1, the intermediate potential output difference Vy(+) is given by:

$$Vy(+)=Vco4(+)-Vco5(+)$$

$$=Vcc \cdot [\{1/2+1/(2 \cdot Rb) \cdot \beta \cdot He \cdot \sin\theta\}-\{1/2-1/(2 \cdot Rb) \cdot \beta \cdot He \cdot \sin\theta\}]$$

$$=Vcc \cdot 1/Rb \cdot \beta \cdot He \cdot \sin\theta.$$

Next, DC currents are fed to flow in the two second conductors 13, 14 in the opposite directions to the above-mentioned directions to apply to the magneto-resistance elements 41, 42, 52, 52 DC magnetic fields enough to saturate the magneto-resistance elements 41, 42, 52, 52 in the directions perpendicular to their longitudinal directions. Subsequently, while certain magnitudes of DC currents are fed to flow in the two second conductors 13, 14 in the opposite directions to the DC currents to apply total magnetic fields of biasing DC magnetic fields plus a magnetic field canceling the external offset magnetic field in the directions perpendicular to the longitudinal directions of the magneto-resistance elements, as with the above case, a DC electric voltage for measurement Vcc is applied between ends of the magneto-resistance element pairs and intermediate potential outputs are taken out from the connected ends. The current Id' to be fed to the one second conductor 13 is the sum of an optimal biasing current −Ib plus a current −Ioffy that applies a magnetic field canceling the Y-axis component Hoffy of the external offset magnetic field to the magneto-resistance element 41, and is given by:

$$Id' = -Ib - Ioffy.$$

The magnetic field H41' to be applied to the magneto-resistance element 41 in this condition is given by:

$$H41' = \gamma \cdot Id' + Hoffy + He \cdot \sin\theta$$

$$= \gamma \cdot (-Ib - Ioffy) + Hoffy + He \cdot \sin\theta$$

$$= -\gamma \cdot Ib + He \cdot \sin\theta.$$

The resistance R41' of the magneto-resistance element 41 in this condition is given by:

$$R41' = Rb + \beta \cdot He \cdot \sin\theta.$$

The current Ie' to be fed to the other second conductor 14 is the sum of an optimal biasing current −Ib plus a current Ioffy that applies a magnetic field canceling the Y-axis component Hoffy of the external offset magnetic field to the magneto-resistance element 42, and is given by:

$$Ie' = -Ib + Ioffy.$$

The magnetic field H42' to be applied to the magneto-resistance element 42 in this condition is given by:

$$H42' = -\gamma \cdot Ie' + Hoffy + He \cdot \sin\theta$$

$$= \gamma \cdot (-Ib + Ioffy) + Hoffy + He \cdot \sin\theta$$

$$= \gamma \cdot Ib + He \cdot \sin\theta.$$

The resistance R42' of the magneto-resistance element 42 in this condition is given by:

$$R42' = Rb - \beta \cdot He \cdot \sin\theta.$$

The intermediate potential output Vco4(−) between the magneto-resistance element 41 and the magneto-resistance element 42 in the third magneto-resistance element pair 4 is obtained by:

$$Vco4(-) = Vcc \cdot \{1/2 - 1/(2 \cdot Rb) \cdot \beta \cdot He \cdot \sin\theta\}.$$

Similarly, the intermediate potential output Vco5(−) between the magneto-resistance element 51 and the magneto-resistance element 52 in the fourth magneto-resistance element pair 5 is given by:

$$Vco5(-) = Vcc \cdot \{1/2 + 1/(2 \cdot Rb) \cdot \beta \cdot He \cdot \sin\theta\}.$$

The intermediate potential output difference Vy(−) between the third magneto-resistance element pair 4 and the fourth magneto-resistance element pair 5 is given by:

$$Vy(-) = Vco4(-) - Vco5(-)$$

$$= Vcc \cdot [\{1/2 - 1/(2 \cdot Rb) \cdot \beta \cdot He \cdot \sin\theta\} - \{1/2 + 1/(2 \cdot Rb) \cdot \beta \cdot He \cdot \sin\theta\}]$$

$$= -Vcc \cdot 1/Rb \cdot \beta \cdot He \cdot \sin\theta.$$

The difference between the intermediate potential output differences is obtained by:

$$Vy = Vy(+) - Vy(-)$$

$$= 2Vcc \cdot 1/Rb \cdot \beta \cdot He \cdot \sin\theta.$$

From the above formula, the output value Vy of the Y axis is not varied by the Y-axis component Hoffy of the external offset magnetic field.
As above described, $$Vx = Vx(+) - Vx(-)$$

$$= 2Vcc \cdot 1/Rb \cdot \beta \cdot He \cdot \cos\theta$$

is established, and therefore the angle θ formed by the horizontal component of the geo-magnetism and the X axis is obtained by:

$$\theta = \tan^{-1}(Vy/Vx).$$

Figure 5:
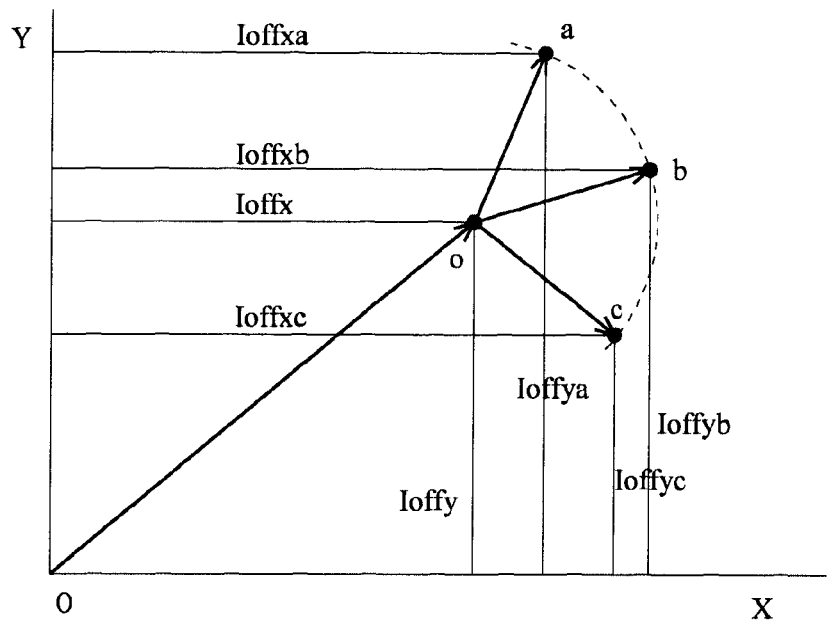
FIG. 5 is an explanatory view for measuring offset current.

In the above description, the sum of a biasing current plus a current for canceling the external offset magnetic field is fed to each of the two first conductors 11, 12, and the two second conductors 13, 14. A description herein will be about how to determine the current for canceling the external offset magnetic field. The two-axis magnetic field sensor is applied with a uniform external offset magnetic field and a geo-magnetism whose direction of application changes depending on the orientation of the two-axis magnetic field sensor. When a two-axis magnetic field sensor is placed at the three points a, b, c on an arc on a plane shown in FIG. 5, a compound vector of the external offset magnetic field vector plus geo-magnetism vector at each point is applied to the two-axis magnetic field sensor at each point.

Each of the DC currents, that is fed to each of the two first conductors 11, 12 and the two second conductors 13, 14 so as to make the intermediate potential output differences Vx and Vy in the X axis direction and the Y axis direction, respectively, of the two-axis magnetic field sensor zero, corresponds to a current for canceling the X-axis component and a current for canceling the Y-axis component of the magnetic field applied to the two-axis magnetic field sensor. The required currents for the two-axis magnetic field sensor placed at the three points a, b, c on the arc to make the output from the two-axis magnetic field sensor zero are assumed to be:
point a: (Ioffxa, Ioffya),
point b: (Ioffxb, Ioffyb), and
point c: (Ioffxc, Ioffyc).
These are the sums of an offset current (Ioffx, Ioffy) required to cancel the external offset magnetic field plus a current required to cancel the geo-magnetism. The offset currents required to cancel the external offset magnetic field are constant. On the contrary, the geo-magnetism is constant in its amount but different in its direction. Letting X axis be the current to be fed to the first conductors and Y axis be the current to be fed to the second conductors in FIG. 5, the length from the origin to the center o of the arc corresponds to the offset current and oa, ob, and oc correspond to a current for canceling the geo-magnetism. Since the geo-magnetism at a, b and c is constant in its amount but different in its direction, the lengths of oa, ob, oc are the same. Thus, the offset current at the center o of the arc can be obtained from the current at the three points a, b, c. By measuring the currents required for a two-axis magnetic field sensor placed at the three points on the arc to make the output zero in advance, the offset current (Ioffx, Ioffy) for canceling the external offset magnetic field can be obtained by simple calculation using the current.

$$Ioffx=(1/2)\cdot[(Ioffxa^2+Ioffya^2)\cdot(Ioffyc-Ioffyb)+\\(Ioffxb^2+Ioffyb^2)\cdot(Ioffya-Ioffyc)+(Ioffxc^2+Ioffyc^2)\cdot(Ioffyb-Ioffya)]/[Ioffxa\cdot(Ioffyc-Ioffyb)+\\Ioffxb\cdot(Ioffya-Ioffyc)+Ioffxc\cdot(Ioffyb-Ioffya)]$$

$$Ioffy=(1/2)\cdot[(Ioffxa^2+Ioffya^2)\cdot(Ioffxc-Ioffxb)+\\(Ioffxb^2+Ioffyb^2)\cdot(Ioffxa-Ioffxc)+(Ioffxc^2+Ioffyc^2)\cdot(Ioffxb-Ioffxa)]/[Ioffya\cdot(Ioffxc-Ioffxb)+\\Ioffyb\cdot(Ioffxa-Ioffxc)+Ioffyc\cdot(Ioffxb-Ioffxa)]$$

As is apparent from the descriptions, the two-axis magnetic field sensor in EXAMPLE 1 can provide an intermediate potential output of the magneto-resistance element pairs, when canceling the external offset magnetic field and accordingly applying the optimal biasing magnetic field to the magneto-resistance elements by feeding a sum of a biasing DC current plus an offset current corresponding to a magnetic field canceling the external offset magnetic field to flow through the plane coil comprising two first conductors and two second conductors arranged perpendicular to the first conductors.

Example 2

Figure 6:
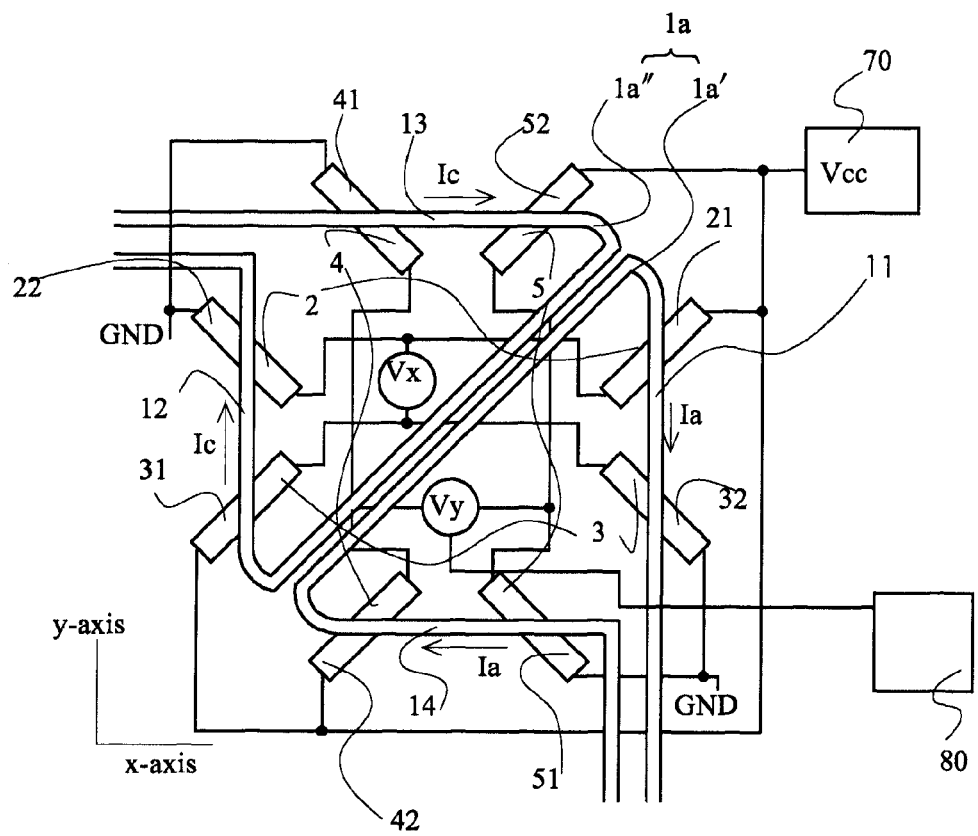
FIG. 6 is a schematic diagram showing a two-axis magnetic field sensor of EXAMPLE 2 according to the present invention.

FIG. 6 is a schematic diagram showing a two-axis magnetic field sensor of EXAMPLE 2 in the present invention. The two-axis magnetic field sensor has a plane coil 1a and four pairs of magneto-resistance elements 2, 3, 4, 5 provided on a plane adjacent to the plane coil 1a and parallel to the plane coil 1a. The plane coil 1a is composed of right isosceles triangle plane coils 1a', 1a" whose hypotenuses are opposite to each other. The right isosceles triangle plane coils 1a', 1a" form a square plane coil with the hypotenuses as a diagonal line. Thus formed square plane coil 1a has two parallel first conductors 11, 12 and two parallel second conductors 13, 14 arranged perpendicular to the first conductors 11, 12. The positional relationship of the four pairs of the magneto-resistance elements and the conductors of the plane coil 1a are the same as in EXAMPLE 1 and their description is not reiterated.

The right isosceles triangle plane coils 1a', 1a" are wound in the same direction several tens of turns. Each of the right isosceles triangle plane coils 1a', 1a" is connected to a DC power source (not shown). When a DC current is fed to flow in the two right isosceles triangle plane coils 1a', 1a" in the same direction, the two right isosceles triangle plane coils 1a', 1a" serve as a single square plane coil 1a. The currents flowing in the opposing hypotenuses (corresponding to a diagonal line when the coils are regarded as a square plane coil) of the right isosceles triangle plane coils 1a', 1a" run in the opposite direction to each other, and therefore the DC magnetic fields generated by the currents cancel each other out, which means that the coils are magnetically a single square coil. On the plane of the magneto-resistance elements, which is parallel to the square plane coil 1a, DC magnetic fields oriented from the inside of the coil to the outside or from the outside to the inside are generated and applied to the magneto-resistance elements 21 to 52. In FIG. 6, the direction in which the second conductor 14 of the right isosceles triangle plane coil 1a' and the second conductor 13 of the right isosceles triangle plane coil 1a" extend is assumed to be an X axis, while the direction in which the first conductor 11 of the right isosceles triangle plane coil 1a' and the first conductor 12 of the right isosceles triangle plane coil 1a" extend is assumed to be a Y axis of orthogonal coordinates. When currents Ia and Ic are fed to flow in the right isosceles triangle plane coils 1a', 1a" clockwise, respectively, a magnetic field in the X direction is applied to the magneto-resistance elements 21 and 32, a magnetic field in the −X direction is applied to the magneto-resistance elements 22 and 31, a magnetic field in the Y direction is applied to the magneto-resistance elements 41 and 52, and a magnetic field in the −Y direction is applied to the magneto-resistance elements 42 and 51. If current −Ia and −Ic are fed to flow in the right isosceles triangle plane coils 1a' and 1a" counterclockwise, respectively, magnetic fields in the opposite directions to the above-mentioned directions are applied to the magneto-resistance elements, respectively.

Each of the magneto-resistance elements is connected as follows. Two magneto-resistance elements, which form a magneto-resistance element pair, have ends, which are positioned inside the square coil and connected to each other, and ends positioned outside the square coil, and a DC electric voltage for measurement Vcc is applied between the ends outside the square coil.

A description will be made about measurement of a bearing by means of the two-axis magnetic field sensor in FIG. 6 with the external offset magnetic field present. Reset currents are fed to flow in the right isosceles triangle plane coils 1a', 1a" counterclockwise in FIG. 6 to apply reset DC magnetic fields to the magneto-resistance elements 21 to 52. Then, predetermined amounts of DC currents are fed to flow in the right isosceles triangle plane coils 1a', 1a" in the opposite directions to the reset currents (i.e. clockwise for the right isosceles triangle plane coils 1a', 1a" in FIG. 6). While total magnetic fields of biasing DC magnetic fields plus a magnetic field canceling the external offset magnetic field are being applied in the directions perpendicular to the longitudinal directions of the magneto-resistance elements, a DC electric voltage for measurement Vcc is applied between the ends of the magneto-resistance element pairs, and intermediate potential outputs are taken out from the connected ends.

Assume that He is a magnitude of the horizontal component of the geo-magnetism, θ is an angle formed between the horizontal component of the geo-magnetism He and the X axis, Hoffx is the X-axis component of the external offset magnetic field, and Hoffy is the Y-axis component. After measurement of offset current by the two-axis magnetic field sensor in EXAMPLE 2 as described in EXAMPLE 1, the currents Ioffx and Ioffy required to cancel the X-axis component Hoffx and Y-axis component Hoffy of the external offset magnetic field, respectively, are determined in advance.

Now, measurement of the magnetic field of the X axis will be described. The currents Ia, Ic to be fed to flow in the plane coil 1a', 1a"clockwise in FIG. 6 are the sum of a biasing current Ib that applies to the magneto-resistance elements biasing magnetic fields most suitable for the two-axis magnetic field sensor to detect a magnetic field plus a current −Ioffx or Ioffx that applies a magnetic field canceling the X-axis component Hoffx of the external offset magnetic field to the magneto-resistance elements 21, 32, 22, 31.

$$Ia=Ib-Ioffx$$

$$Ic=Ib+Ioffx$$

The intermediate potential output Vco2(+) between the magneto-resistance element 21 and the magneto-resistance element 22 in the first magneto-resistance element pair 2 in this condition is given by:

$$Vco2(+)=Vcc\cdot\{1/2+1/(2\cdot Rb)\cdot\beta\cdot He\cos\theta\}.$$

The intermediate potential output $V_{co3}(+)$ between the magneto-resistance element 31 and the magneto-resistance element 32 in the second magneto-resistance element pair 3 is given by:

$$V_{co3}(+) = V_{cc} \cdot \{1/2 - 1/(2 \cdot R_b) \cdot \beta \cdot H_e \cdot \cos\theta\}.$$

Since the intermediate potential output difference between the connected ends of the first magneto-resistance element pair 2 and the connected ends of the second magneto-resistance element pair 3 is taken as Vx in FIG. 6, the intermediate potential output difference $V_x(+)$ is given by:

$$V_x(+) = V_{co2}(+) - V_{co3}(+)$$

$$= V_{cc} \cdot [\{1/2 + 1/(2 \cdot R_b) \cdot \beta \cdot H_e \cdot \cos\theta\} - \{1/2 - 1/(2 \cdot R_b) \cdot \beta \cdot H_e \cdot \cos\theta\}]$$

$$= V_{cc} \cdot 1/R_b \cdot \beta \cdot H_e \cdot \cos\theta.$$

Next, DC currents are fed to flow in the right isosceles triangle plane coils $1a'$, $1a''$ in the opposite directions to the above-mentioned directions to apply to the magneto-resistance elements 21, 32, 22, 31 DC magnetic fields enough to saturate the magneto-resistance elements 21, 32, 22, 31 in the directions perpendicular to their longitudinal directions. Then, predetermined amounts of DC currents are fed to flow in the right isosceles triangle plane coils $1a'$, $1a''$ in the opposite directions to the DC current to apply total magnetic fields of biasing DC magnetic fields plus a magnetic field canceling the external offset magnetic field in the directions perpendicular to the longitudinal directions of the magneto-resistance elements. During the application of the total magnetic fields to the magneto-resistance elements, a DC electric voltage for measurement Vcc is applied between the ends of the magneto-resistance element pairs, and intermediate potential outputs are taken out from the connected ends.

The currents $I_a'$, $I_c''$ flowing in the right isosceles triangle plane coils $1a'$, $1a''$ counterclockwise in FIG. 6 are the sum of a biasing DC current Ib that applies to the magneto-resistance elements biasing magnetic fields most suitable for the two-axis magnetic field sensor to detect a magnetic field plus a current $-I_{offx}$ or $I_{offx}$ that applies a magnetic field canceling the X-axis component $H_{offx}$ of the external offset magnetic field to the magneto-resistance elements 21, 32, 22, 31.

$$I_a' = I_b - I_{offx}$$

$$I_c' = -I_b + I_{offx}$$

The intermediate potential output $V_{co2}(-)$ between the magneto-resistance element 21 and the magneto-resistance element 22 in the first magneto-resistance element pair 2 in this condition is given by:

$$V_{co2}(-) = V_{cc} \cdot \{1/2 - 1/(2 \cdot R_b) \cdot \beta \cdot H_e \cdot \cos\theta\}.$$

The intermediate potential output $V_{co3}(-)$ between the magneto-resistance element 31 and the magneto-resistance element 32 in the second magneto-resistance element pair 3 is given by:

$$V_{co3}(-) = V_{cc} \cdot \{1/2 + 1/(2 \cdot R_b) \cdot \beta \cdot H_e \cdot \cos\theta\}.$$

Since the intermediate potential output difference between the connected ends of the first magneto-resistance element pair 2 and the connected ends of the second magneto-resistance element pair 3 is taken out as Vx in FIG. 6, the intermediate potential output difference $V_x(-)$ is given by:

$$V_x(-) = V_{co2}(-) - V_{co3}(-)$$

$$= V_{cc} \cdot [\{1/2 - 1/(2 \cdot R_b) \cdot \beta \cdot H_e \cdot \cos\theta\} - \{1/2 + 1/(2 \cdot R_b) \cdot \beta \cdot H_e \cdot \cos\theta\}]$$

$$= -V_{cc} \cdot 1/R_b \cdot \beta \cdot H_e \cdot \cos\theta.$$

Next, measurement of the magnetic field of the Y axis will be described. Currents Ia, Ic to be fed to flow in the right isosceles triangle plane coils $1a'$, $1a''$ clockwise in FIG. 6 are the sum of a biasing current Ib that applies to the magneto-resistance elements biasing magnetic fields most suitable for the two-axis magnetic field sensor to detect a magnetic field plus a current $-I_{offy}$ or $I_{offy}$ that applies a magnetic field canceling the Y-axis component $H_{offy}$ of the external offset magnetic field to the magneto-resistance elements 41, 52, 42, 51.

$$I_a = I_b - I_{offy}$$

$$I_c = I_b + I_{offy}$$

The intermediate potential output $V_{co4}(+)$ between the magneto-resistance element 41 and the magneto-resistance element 42 in the third magneto-resistance element pair 4 in this condition is given by:

$$V_{co4}(+) = V_{cc} \cdot \{1/2 + 1/(2 \cdot R_b) \cdot \beta \cdot H_e \cdot \sin\theta\}.$$

Similarly, the intermediate potential output $V_{co5}(+)$ between the magneto-resistance element 51 and the magneto-resistance element 52 in the fourth magneto-resistance element pair 5 is given by:

$$V_{co5}(+) = V_{cc} \cdot \{1/2 - 1/(2 \cdot R_b) \cdot \beta \cdot H_e \cdot \sin\theta\}.$$

Since the intermediate potential output difference between the connected ends of the third magneto-resistance element pair 4 and the connected ends of the fourth magneto-resistance element pair 5 is taken out as Vy in FIG. 6, the intermediate potential output difference $V_y(+)$ is given by:

$$V_y(+) = V_{co4}(+) - V_{co5}(+)$$

$$= V_{cc} \cdot [\{1/2 + 1/(2 \cdot R_b) \cdot \beta \cdot H_e \cdot \sin\theta\} - \{1/2 - 1/(2 \cdot R_b) \cdot \beta \cdot H_e \cdot \sin\theta\}]$$

$$= V_{cc} \cdot /R_b \cdot \beta \cdot H_e \cdot \sin\theta.$$

Currents $I_a'$, $I_c'$ to be fed to flow in the right isosceles triangle plane coils $1a'$, $1a''$ counterclockwise in FIG. 6 are the sum of a biasing current Ib that applies to the magneto-resistance elements biasing magnetic fields most suitable for the two-axis magnetic field sensor to detect a magnetic field plus a current $-I_{offy}$ or $I_{offy}$ that applies a magnetic field canceling the Y-axis component $H_{offy}$ of the external offset magnetic field to the magneto-resistance elements 41, 52, 42, 51.

$$I_a' = I_b - I_{offy}$$

$$I_c' = -I_b + I_{offy}$$

The intermediate potential output $V_{co4}(-)$ between the magneto-resistance element 41 and the magneto-resistance element 42 in the third magneto-resistance element pair 4 in this condition is given by:

$$V_{co4}(-) = V_{cc} \cdot \{1/2 - 1/(2 \cdot R_b) \cdot \beta \cdot H_e \cdot \sin\theta\}.$$

Similarly, the intermediate potential output $V_{co5}(-)$ between the magneto-resistance element 51 and the magneto-resistance element 52 in the fourth magneto-resistance element pair 5 is given by:

$$V_{co5}(-) = V_{cc} \cdot \{1/2 + 1/(2 \cdot R_b) \cdot \beta \cdot H_e \cdot \sin\theta\}.$$

Since the intermediate potential output difference between the connected ends of the third magneto-resistance element pair 4 and the connected ends of the fourth magneto-resistance element pair 5 is taken out as Vy in FIG. 6, the intermediate potential output difference Vy(−) is given by:

$$Vy(-)=Vco4(-)-Vco5(-)$$

$$=Vcc \cdot [\{1/2-1/(2 \cdot Rb) \cdot \beta \cdot He \cdot \sin \theta\}-\{1/2+1/(2 \cdot Rb) \cdot \beta \cdot He \cdot \sin \theta\}]$$

$$=-Vcc \cdot 1/Rb \cdot \beta \cdot He \cdot \sin \theta.$$

These intermediate potential output differences can be obtained for each of the X direction and Y direction by:

$$Vx=Vx(+)-Vx(-)$$

$$=2Vcc \cdot 1/Rb \cdot \beta \cdot He \cdot \cos \theta$$

$$Vy=Vy(+)-Vy(-)$$

$$=2Vcc \cdot 1/Rb \cdot \beta \cdot He \cdot \sin \theta,$$

and an angle θ formed between the horizontal component of the geo-magnetism and the X axis can be obtained by:

$$\theta=\tan^{-1}(Vy/Vx).$$

From the above formula, the output values Vx, Vy of the X axis and Y axis are not varied by the X-axis component Hoffx and the Y-axis component Hoffy of the external offset magnetic field.

The two-axis magnetic field sensor in EXAMPLE 2 can provide intermediate potential outputs of the magneto-resistance element pairs, when canceling the external offset magnetic field and accordingly applying the optimal biasing magnetic field to the magneto-resistance elements by feeding a sum of a current corresponding to the biasing magnetic fields plus the magnetic field canceling the external offset magnetic field to flow through each of the two plane coils.

Example 3

Measurement of a bearing and calculation of a magnetic field by a two-axis magnetic field sensor with external offset magnetic fields present can be performed by plane coils having right-angle apexes opposite to each other in EXAMPLE 3 in substantially the same manner as those by the square plane coil formed by arranging the hypotenuses of the two right isosceles triangles so as to be opposite to each other in EXAMPLE 2, and therefore their descriptions will not be reiterated.

Figure 7:
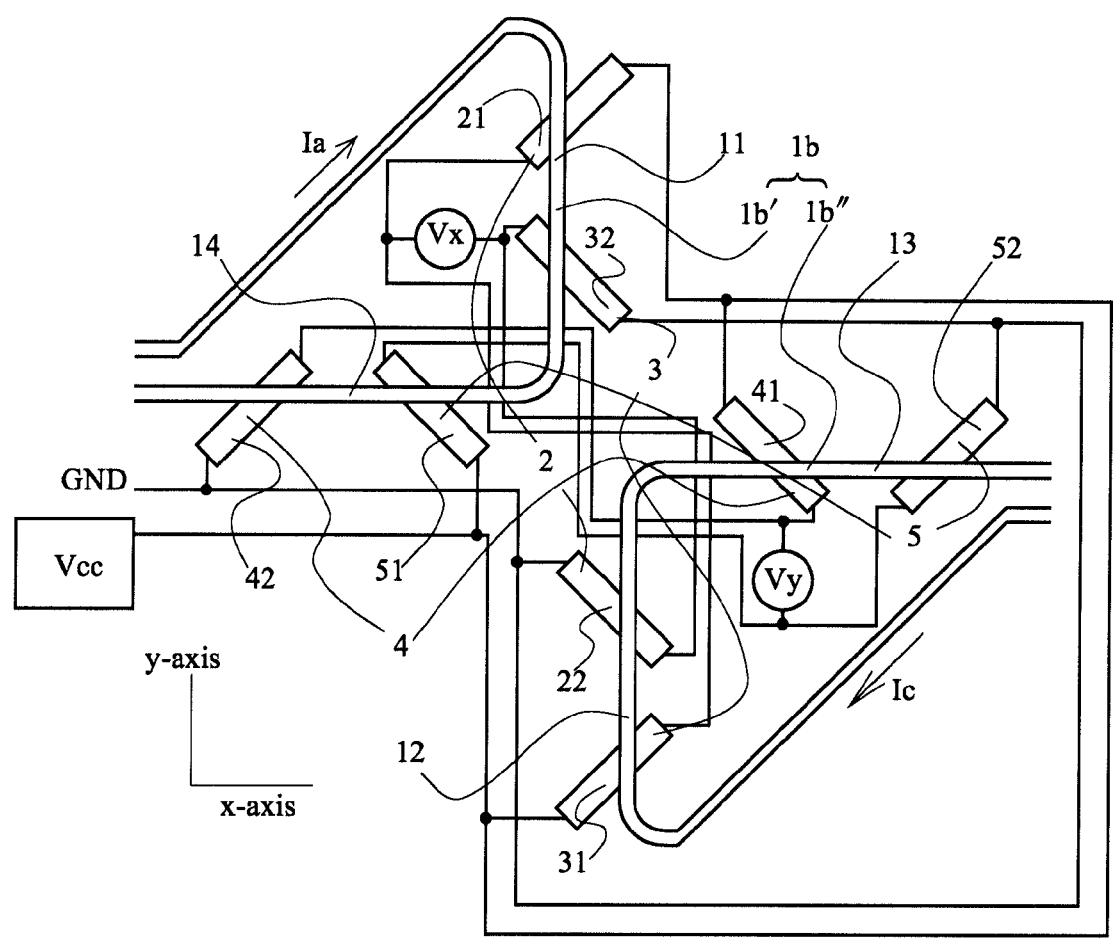
FIG. 7 is a schematic diagram showing a two-axis magnetic field sensor of EXAMPLE 3 according to the present invention.

FIG. 7 is a schematic diagram of the two-axis magnetic field sensor according to EXAMPLE 3 of the present invention. The two-axis magnetic field sensor has two parallel right isosceles triangle plane coils 1b', 1b" provided adjacent to a plane in which magneto-resistance elements are provided and parallel to the plane. In the plane of the magneto-resistance elements, magneto-resistance elements 21, 22, 31, 32, 41, 42, 51, 52 are provided.

The right isosceles triangle plane coil 1b' and the right isosceles triangle plane coil 1b" are arranged so that their right-angle apexes face each other and to form a plane coil 1b in which the two sides perpendicular to each other serve as diagonal lines. Thus formed plane coil 1b has two first conductors 11, 12 parallel to each other and two second conductors 13, 14 parallel to each other. The longitudinal directions of the magneto-resistance elements 21 and 32 cross the first conductor 11 of the right isosceles triangle plane coil 1b' at an angle of 30° or more and less than 90°, preferably at an angle of 45° or more and less than 90°, more preferably at an angle from 40° to 50°, and at 45° shown in this EXAMPLE. Similarly, the magneto-resistance elements 22 and 31 cross the first conductor 12 of the right isosceles triangle plane coil 1b", the magneto-resistance elements 41 and 52 cross the second conductor 13 of the right isosceles triangle plane coil 1b" and the magneto-resistance elements 42 and 51 cross the second conductor 14 of the right isosceles triangle plane coil 1b'.

The two magneto-resistance elements 21, 32 crossing the first conductor 11 of the right isosceles triangle plane coil 1b', the two magneto-resistance elements 42, 51 crossing the second conductor 14, the two magneto-resistance elements 22, 31 crossing the first conductor 12 of the right isosceles triangle plane coil 1b", the two magneto-resistance elements 41, 52 crossing the second conductor 13 are not parallel with each other in their longitudinal directions. FIG. 7 illustrates that the two magneto-resistance elements crossing each conductor of the plane coils are perpendicular to each other. The two magneto-resistance elements 21 and 22 crossing the two parallel first conductors 11, 12 of the plane coil 1b, respectively, form a first magneto-resistance element pair 2. The magneto-resistance elements 21 and 22 of the first magneto-resistance element pair 2 are not parallel with each other in their longitudinal directions. FIG. 7 illustrates the two magneto-resistance elements forming each of the magneto-resistance element pairs are perpendicular to each other. Similarly, each of the two magneto-resistance elements 31 and 32, 41 and 42, and 51 and 52, crossing the two parallel conductors of the plane coil 1b, forms magneto-resistance element pairs 3, 4 and 5, respectively. The magneto-resistance elements of these magneto-resistance element pairs are not parallel with each other in their longitudinal directions. The two magneto-resistance elements forming the magneto-resistance element pairs have ends connected to each other and other ends between which a DC electric voltage for measurement Vcc is applied.

The right isosceles triangle plane coils 1b', 1b" are wound in the same direction several tens of turns. When DC currents are fed to flow in the two right isosceles triangle plane coils 1b', 1b" in the same direction, the two right isosceles triangle plane coils 1b', 1b" act as a plane coil 1b. Since the hypotenuses of the right isosceles triangle plane coils 1b', 1b" are away from the magneto-resistance elements, and since the magneto-resistance elements are little influenced by magnetic fields, the right isosceles triangle plane coils 1b', 1b" can be regarded as a combination of two L-shaped coils from a point of view of magnetism. On the plane of the magneto-resistance elements parallel to the plane coil, DC magnetic fields oriented from the inside of the coil to the outside or from the outside to the inside are caused and applied to the magneto-resistance elements 21 to 52. When currents Ia and Ic are fed to flow in the right isosceles triangle plane coils 1b' and 1b" clockwise, respectively, in FIG. 7, a magnetic field in the X direction, a magnetic field in the −X direction, a magnetic field in the Y direction and a magnetic field in the −Y direction are applied to the magneto-resistance elements 21 and 32, the magneto-resistance elements 22 and 31, the magneto-resistance elements 41 and 52 and the magneto-resistance elements 42 and 51, respectively. When currents −Ia and −Ic are fed to flow in the right isosceles triangle plane coils 1b' and 1b" counterclockwise, respectively, magnetic fields oriented in the opposite directions to the previously mentioned directions are applied to the magneto-resistance elements, respectively. As in the case of EXAMPLE 1, an offset current for canceling the external offset magnetic field is obtained in advance also in EXAMPLE 3. Then, biasing magnetic fields are applied to the magneto-resistance elements simultaneously with application of a magnetic field canceling the external offset magnetic field to measure magnetic field directions. The two-axis magnetic field sensor in EXAMPLE 3 works in the same way as the two-axis magnetic field sensors described in EXAMPLE 1 and EXAMPLE 2.

Example 4

Measurement of a bearing and calculation of a magnetic field by a two-axis magnetic field sensor with external offset magnetic fields present can be performed by a two-axis magnetic field sensor in EXAMPLE 4 in substantially the same manner as those by the two-axis magnetic field sensors in the above-described EXAMPLES, and therefore their descriptions will not be reiterated.

Figure 8:
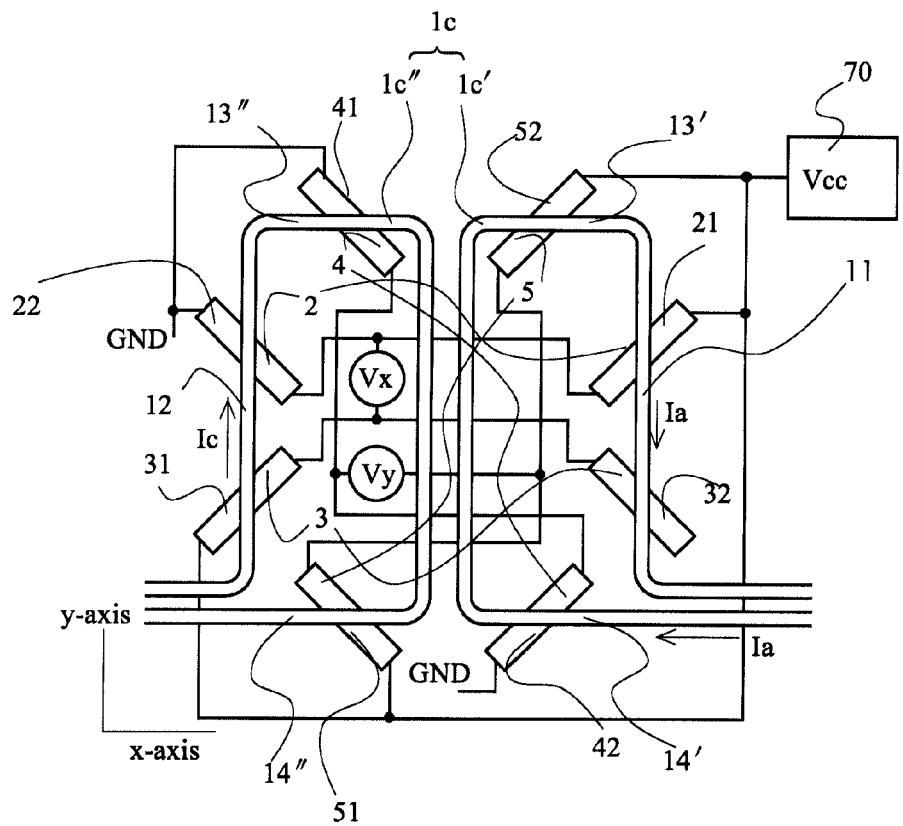
FIG. 8 is a schematic diagram showing a two-axis magnetic field sensor of EXAMPLE 4 according to the present invention.

FIG. 8 is a schematic diagram of the two-axis magnetic field sensor according to EXAMPLE 4 of the present invention. The two-axis magnetic field sensor has a square plane coil 1c composed of two rectangular plane coils 1c' and 1c" arranged along their long sides, and the square plane coil 1c is provided adjacent to a plane in which magneto-resistance elements are provided and parallel to the plane. On the plane of the magneto-resistance elements, magneto-resistance elements 21, 22, 31, 32, 41, 42, 51, 52 are provided.

The rectangular plane coil 1c' and the rectangular plane coil 1c" have their long sides adjacent to each other to form a square shape. Thus formed square plane coil 1c has three sets of conductors 11 and 12, 13' and 14' and 13" and 14", the conductors in a set being parallel to each other. The longitudinal directions of the magneto-resistance elements 21 and 32 cross the conductor 11 of the rectangular plane coil 1c' at an angle of 30° or more and less than 90°, preferably at an angle of 45° or more and less than 90°, more preferably at an angle from 40° to 50°, and at 45° shown in this EXAMPLE. Similarly, the magneto-resistance elements 22 and 31 cross the conductor 12 of the rectangular plane coil 1c", the magneto-resistance element 41 crosses the conductor 13" of the rectangular plane coil 1c", the magneto-resistance element 42 crosses the conductor 14' of the rectangular plane coil 1c', the magneto-resistance element 52 crosses the conductor 13' of the rectangular plane coil 1c' and the magneto-resistance element 51 crosses the conductor 14" of the rectangular plane coil 1c".

As shown in FIG. 8, the magneto-resistance elements 21 and 32 crossing the conductor 11 of the rectangular plane coil 1c', the magneto-resistance element 52 crossing the conductor 13' of the rectangular plane coil 1c' and the magneto-resistance elements 41 crossing the conductor 13" of the rectangular plane coil 1c", the magneto-resistance element 42 crossing the conductor 14' of the rectangular plane coil 1c' and the magneto-resistance element 51 crossing the conductor 14" of the rectangular plane coil 1c", and the magneto-resistance elements 22 and 31 crossing the conductor 12 of the rectangular plane coil 1c" are not parallel to each other along the longitudinal directions of the magneto-resistance elements. The magneto-resistance element 52 crossing the conductor 13' and the magneto-resistance element 42 crossing the conductor 14', and the magneto-resistance element 41 crossing the conductor 13" and the magneto-resistance element 51 crossing the conductor 14" are parallel to each other along the longitudinal directions of the magneto-resistance elements.

The two magneto-resistance elements 21 and 22, whose longitudinal directions cross the parallel conductors of the square plane coil 1c, form a first magneto-resistance element pair 2. The longitudinal directions of the magneto-resistance elements 21 and 22 of the first magneto-resistance element pair 2 are not parallel to each other. FIG. 8 illustrates the two magneto-resistance elements forming a magneto-resistance element pair being perpendicular to each other. Similarly, the magneto-resistance elements 31 and 32, whose longitudinal directions cross the parallel conductors of the square plane coil 1c, form a second magneto-resistance element pair 3, and the longitudinal directions of the magneto-resistance elements are not parallel to each other. The magneto-resistance elements 41 and 42, whose longitudinal directions cross the parallel conductors of the square plane coil 1c, form a third magneto-resistance element pair 4, and the magneto-resistance elements 51 and 52 form a fourth magneto-resistance element pair 5. The two magneto-resistance elements forming each of the magneto-resistance element pairs have ends positioned inside the square plane coil 1c and connected to each other, and ends positioned outside the square plane coil 1c and between which a DC electric voltage for measurement Vcc is applied.

The rectangular plane coils 1c', 1c" are wound in the same direction several tens of turns. When DC currents are fed to flow in the two rectangular plane coils 1c', 1c" in the same direction, the two rectangular plane coils 1c', 1c" act as a single square plane coil 1c. Since currents, each flowing through the sides arranged adjacent to each other of the rectangular plane coils 1c', 1c" in the opposite directions to each other, cause DC magnetic fields that cancel out each other, the rectangular plane coils 1c', 1c" can be regarded as a single square plane coil from a point of view of magnetism. On the plane of the magneto-resistance elements parallel to the square plane coil, DC magnetic fields oriented from the inside of the coil to the outside or from the outside to the inside are caused and applied to the magneto-resistance elements 21 to 52. When currents Ia and Ic are fed to flow in the rectangular plane coil 1c' and 1c" clockwise, respectively, in FIG. 8, a magnetic field in the X direction, a magnetic field in the −X direction, a magnetic field in the Y direction and a magnetic field in the −Y direction are applied to the magneto-resistance elements 21 and 32, the magneto-resistance elements 22 and 31, the magneto-resistance elements 41 and 52 and the magneto-resistance elements 42 and 51, respectively. When currents −Ia and −Ic are fed to flow in the rectangular plane coils 1c' and 1c" counterclockwise, respectively, magnetic fields oriented in the opposite directions to the previously mentioned directions are applied to the magneto-resistance elements, respectively. As described in EXAMPLE 1, an offset current for canceling the external offset magnetic field is obtained in advance also in EXAMPLE 4. Then, biasing magnetic fields are applied to the magneto-resistance elements simultaneously with application of a magnetic field canceling the external offset magnetic field to measure magnetic field directions. The two-axis magnetic field sensor in EXAMPLE 4 can measure magnetic field directions like the two-axis magnetic field sensors described in EXAMPLE 1 and EXAMPLE 2.

With the two rectangular plane coils, the magneto-resistance elements need to be arranged differently from those with the two right isosceles triangle plane coils in EXAMPLE 2. This is because the magneto-resistance elements 41 and 52 in EXAMPLE 4 cross separate sides of the coils, which are different from the magneto-resistance elements 41 and 52 in EXAMPLE 2 crossing one side of a coil.

INDUSTRIAL APPLICABILITY

Even in the environment influenced by a uniform external magnetic field in addition to the geo-magnetism, the two-axis magnetic field sensor of the present invention can cancel the influence of the uniform external magnetic field and provide the direction of the geo-magnetism or magnetic field, and accordingly is a device having an advantage in measuring a bearing.

The invention claimed is:

1. A two-axis magnetic field sensor comprising:

a plurality of plane coils each including a first conductor and two second conductors perpendicular to the first conductor and parallel to each other, the first conductor of a first plane coil of the plurality of plane coils being in parallel with the first conductor of a second plane coil of the plurality of plane coils, and the first conductor of a third plane coil of the plurality of plane coils being in parallel with the first conductor of a fourth plane coil of the plurality of plane coils;

on a plane adjacent to the plurality of plane coils and parallel to the plurality of plane coils, a pair of first magneto-resistance elements each having a first end and a second end in a longitudinal direction, a first element of the pair of first magneto-resistance elements crossing only the first conductor of the first plane coil in the longitudinal direction of the first element of the pair of first magneto-resistance elements at an angle of 30 degrees or more and less than 90 degrees with respect to the first conductor of the first plane coil, and a second element of the pair of first magneto-resistance elements crossing only the first conductor of the second plane coil in the longitudinal direction of the second element of the pair of first magneto-resistance elements at an angle of 30 degrees or more and less than 90 degrees with respect to the first conductor of the second plane coil, the longitudinal directions of the pair of first magneto-resistance elements being not parallel to each other, and the first ends of the pair of first magneto-resistance elements being positioned between the first conductors of the first and second plane coils and connected to each other;

a pair of second magneto-resistance elements each having a first end and a second end in a longitudinal direction, a first element of the pair of second magneto-resistance elements crossing only the first conductor of the first plane coil in the longitudinal direction of the first element of the pair of second magneto-resistance elements at an angle of 30 degrees or more and less than 90 degrees with respect to the first conductor of the first plane coil, and a second element of the pair of second magneto-resistance elements crossing only the first conductor of the second plane coil in the longitudinal direction of the second element of the pair of second magneto-resistance elements at an angle of 30 degrees or more and less than 90 degrees with respect to the first conductor of the second plane coil, the longitudinal directions of the pair of second magneto-resistance elements being not parallel to each other, and the first ends of the pair of second magneto-resistance elements being positioned between the first conductors of the first and second plane coils and connected to each other;

a pair of third magneto-resistance elements each having a first end and a second end in a longitudinal direction, a first element of the pair of third magneto-resistance elements crossing only the first conductor of the third plane coil in the longitudinal direction of the first element of the pair of third magneto-resistance elements at an angle of 30 degrees or more and less than 90 degrees with respect to the first conductor of the third plane coil, and a second element of the pair of third magneto-resistance elements crossing only the first conductor of the fourth plane coil in the longitudinal direction of the second element of the pair of third magneto-resistance elements at an angle of 30 degrees or more and less than 90 degrees with respect to the first conductor of the fourth plane coil, the longitudinal directions of the pair of third magneto-resistance elements being not parallel to each other, and the first ends of the pair of third magneto-resistance elements being positioned between the first conductors of the third and fourth plane coils and connected to each other;

a pair of fourth magneto-resistance elements each having a first end and a second end in a longitudinal direction, a first element of the pair of fourth magneto-resistance elements crossing only the first conductor of the third plane coil in the longitudinal direction of the first element of the pair of fourth magneto-resistance elements at an angle of 30 degrees or more and less than 90 degrees with respect to the first conductor of the third plane coil, and a second element of the pair of fourth magneto-resistance elements crossing only the first conductor of the fourth plane coil in the longitudinal direction of the second element of the pair of fourth magneto-resistance elements at an angle of 30 degrees or more and less than 90 degrees with respect to the first conductor of the fourth plane coil, the longitudinal directions of the pair of fourth magneto-resistance elements being not parallel to each other, and the first ends of the pair of fourth magneto-resistance elements being positioned between the first conductors of the third and fourth plane coils and connected to each other;

a first DC power source which supplies a current flow through the first conductor of the first plane coil so as to apply a magnetic field to saturate the two magneto-resistance elements crossing the first conductor of the first plane coil in a direction, a second DC power source which supplies a current flow through the first conductor of the second plane coil so as to apply a magnetic field to saturate the two magneto-resistance elements crossing the first conductor of the second plane coil in a direction opposite to the direction of the magnetic field saturating the two magneto-resistance elements crossing the first conductor of the first plane coil, a third DC power source which supplies a current flow through the first conductor of the third plane coil so as to apply a magnetic field to saturate the two magneto-resistance elements crossing the first conductor of the third plane coil in a direction, a fourth DC power source which supplies a current flow through the first conductor of the fourth plane coil so as to apply a magnetic field to saturate the two magneto-resistance elements crossing first conductor of the fourth plane coil in a direction opposite to the direction of the magnetic field saturating the two magneto-resistance elements crossing the first conductor of the third plane coil, and the first DC power source supplies a current flow through the first conductor of the first plane coil so as to apply to the two magneto-resistance elements crossing the first conductor of the first plane coil, a total magnetic field including a certain amount of a biasing magnetic field in a direction opposite to the magnetic field applied to saturate the two magneto-resistance elements crossing the first conductor of the first plane coil plus a magnetic field canceling an external offset magnetic field applied to the two magneto-resistance elements crossing the first conductor of the first plane coil, the second DC power source supplies a current flow through the first conductor of the second plane coil so as to apply, to the two magneto-resistance elements crossing the first conductor of the second plane coil, a total magnetic field including a certain amount of a biasing magnetic field in a direction opposite to the magnetic field applied to saturate the two magneto-resistance elements crossing the first conductor of the second plane coil plus a magnetic field canceling an external offset magnetic field applied to the two magneto-resistance elements crossing the first conductor of the second plane coil, the third DC power source supplies a current flow through the first conductor of the third plane coil so as to apply, to the two magneto-resistance elements crossing the first conductor of the third plane coil, a total magnetic field including a certain amount of a biasing magnetic field in a direction opposite to the magnetic field applied to saturate the two magneto-resistance elements crossing the first conductor of the third plane coil plus a magnetic field canceling an external offset magnetic field applied to the two magneto-resistance elements crossing the first conductor of the third plane coil, and the fourth DC power source supplies a current flow through the first conductor of the fourth plane coil so as to apply, to the two magneto-resistance elements crossing the first conductor of the fourth plane coil, a total magnetic field including a certain amount of a biasing magnetic field in a direction opposite to the magnetic field applied to saturate the two magneto-resistance elements crossing the first conductor of the fourth plane coil plus a magnetic field canceling an external offset magnetic field applied to the two magneto-resistance elements crossing the first conductor of the fourth plane coil;

a measurement power source which applies a DC electric voltage for measurement: between the second ends of the pair of the first magneto-resistance elements, the second ends of the pair of the first magneto-resistance elements not positioned between the first conductors of the first and second plane coils, between the second ends of the pair of the second magneto-resistance elements, the second ends of the pair of the second magneto-resistance elements not positioned between the first conductors of the first and second plane coils, between the second ends of the pair of the third magneto-resistance elements, the second ends of the pair of the third magneto-resistance elements not positioned between the first conductors of the third and fourth plane coils, and between the second ends of the pair of the fourth magneto-resistance elements, the second ends of the pair of the fourth magneto-resistance elements not positioned between the first conductors of the third and fourth plane coils; and a device which detects a first intermediate potential output from the connected first ends of the pair of the first magneto-resistance elements and a second intermediate potential output from the connected first ends of the pair of the second magneto-resistance elements to get a first potential output difference between the first intermediate potential output and the second intermediate potential output, and which detects a third intermediate potential output from the connected first ends of the pair of the third magneto-resistance elements and a fourth intermediate potential output from the connected first ends of the pair of the fourth magneto-resistance elements to get a second potential output difference between the third intermediate potential output and the fourth intermediate potential output, while the DC electric voltage for measurement is applied to each pair of the magneto-resistance elements, and the device measures a magnetic field direction from the first potential output difference and the second potential output difference.

2. A two-axis magnetic field sensor as set forth in claim 1, further including each of the magneto-resistance elements crosses its respective conductor in the longitudinal direction of each magneto-resistance element at an angle of 40 degrees or more and less than 70 degrees with respect to its respective conductor.

3. A two-axis magnetic field sensor comprising:

first and second plane coils, each having a first conductor and a second conductor, the first conductor of the first plane coil being parallel to the first conductor of the second plane coil, and the second conductors of the first and second plane coils being perpendicular to the first conductors of the first and second plane coils and parallel to each other, the first and second conductors of the first plane coil constituting two sides of a right triangle plane coil and connected in series with a first DC power source, and the first and second conductors of the second plane coil constituting two sides of another right triangle plane coil and connected in series with a second DC power source;

on a plane adjacent to the plane coils and parallel to the plane coils, a pair of first magneto-resistance elements each having ends in a longitudinal direction, one of the pair of first magneto-resistance elements crossing only one of the two first conductors in the longitudinal direction of the one of the pair of first magneto-resistance elements at an angle of 30 degrees or more and less than 90 degrees with respect to the one of the two first conductors, and the other of the pair of first magneto-resistance elements crossing only the other of the two first conductors in the longitudinal direction of the other of the pair of first magneto-resistance elements at an angle of 30 degrees or more and less than 90 degrees with respect to the other of the two first conductors, the longitudinal directions of the pair of first magneto-resistance elements being not parallel to each other, and one end of each of the pair of first magneto-resistance elements being positioned between the two first conductors and connected to each other;

a pair of second magneto-resistance elements each having ends in a longitudinal direction, one of the pair of second magneto-resistance elements crossing only the other of the two first conductors in the longitudinal direction of the one of the pair of second magneto-resistance elements at an angle of 30 degrees or more and less than 90 degrees with respect to the other of the two first conductors, and the other of the pair of second magneto-resistance elements crossing only the one of the two first conductors in the longitudinal direction of the other of the pair of second magneto-resistance elements at an angle of 30 degrees or more and less than 90 degrees with respect to the one of the two first conductors, the longitudinal directions of the pair of second magneto-resistance elements being not parallel to each other, and one end of each of the pair of second magneto-resistance elements being positioned between the two first conductors and connected to each other;

a pair of third magneto-resistance elements each having ends in a longitudinal direction, one of the pair of third magneto-resistance elements crossing only one of the two second conductors in the longitudinal direction of the one of the pair of third magneto-resistance elements at an angle of 30 degrees or more and less than 90 degrees with respect to the one of the two second conductors, and the other of the pair of third magneto-resistance elements crossing only the other of the two second conductors in the longitudinal direction of the other of the pair of third magneto-resistance elements at an angle of 30 degrees or more and less than 90 degrees with respect to the other of the two second conductors, the longitudinal directions of the pair of third magneto-resistance elements being not parallel to each other, and one end of each of the pair of third magneto-resistance elements being positioned between the two second conductors and connected to each other;

a pair of fourth magneto-resistance elements each having ends in a longitudinal direction, one of the pair of fourth magneto-resistance elements crossing only the other of the two second conductors in the longitudinal direction of the one of the pair of fourth magneto-resistance elements at an angle of 30 degrees or more and less than 90 degrees with respect to the other of the two second conductors, and the other of the pair of fourth magneto-resistance elements crossing only the one of the two second conductors in the longitudinal direction of the other of the pair of fourth magneto-resistance elements at an angle of 30 degrees or more and less than 90 degrees with respect to the one of the two second conductors, the longitudinal directions of the pair of fourth magneto-resistance elements being not parallel to each other, and one end of each of the pair of fourth magneto-resistance elements being positioned between the two second conductors and connected to each other;

the first DC power source supplies a current flow through the one of the two first conductors and the one of the two second conductors so as to apply a magnetic field to saturate the two magneto-resistance elements crossing the one of the two first conductors in a direction and so as to apply a magnetic field to saturate the two magneto-resistance elements crossing the one of the two second conductors in a direction, the second DC power source supplies a current flow through the other of the two first conductors and the other of the two second conductors so as to apply a magnetic field to saturate the two magneto-resistance elements crossing the other of the two first conductors in a direction opposite to the direction of the magnetic field saturating the two magneto-resistance elements crossing the one of the two first conductors and so as to apply a magnetic field to saturate the two magneto-resistance elements crossing the other of the two second conductors, and the first DC power source supplies a current flow through the one of the two first conductors so as to apply to the two magneto-resistance elements crossing the one of the two first conductors, a total magnetic field including a certain amount of a biasing magnetic field in a direction opposite to the magnetic field applied to saturate the two magneto-resistance elements crossing the one of the two first conductors plus a magnetic field canceling an external offset magnetic field applied to the two magneto-resistance elements crossing the one of the two first conductors, the first DC power source also supplies a current flow through the one of the two second conductors so as to apply, to the two magneto-resistance elements crossing the one of the two second conductors, a total magnetic field including a certain amount of a biasing magnetic field in a direction opposite to the magnetic field applied to saturate the two magneto-resistance elements crossing the one of the two second conductors plus a magnetic field canceling an external offset magnetic field applied to the two magneto-resistance elements crossing the one of the two second conductors, and the second DC power source supplies a current flow through the other of the two first conductors so as to apply, to the two magneto-resistance elements crossing the other of the two first conductors, a total magnetic field including a certain amount of a biasing magnetic field in a direction opposite to the magnetic field applied to saturate the two magneto-resistance elements crossing the other of the two first conductors plus a magnetic field canceling an external offset magnetic field applied to the two magneto-resistance elements crossing the other of the two first conductors, the second DC power source also supplies a current flow through the other of the two second conductors so as to apply, to the two magneto-resistance elements crossing the other of the two second conductors, a total magnetic field including a certain amount of a biasing magnetic field in a direction opposite to the magnetic field applied to saturate the two magneto-resistance elements crossing the other of the two second conductors plus a magnetic field canceling an external offset magnetic field applied to the two magneto-resistance elements crossing the other of the two second conductors;

a measurement power source which applies a DC electric voltage for measurement: between ends of the pair of the first magneto-resistance elements positioned outside the two first conductors, between ends of the pair of the second magneto-resistance elements positioned outside the two first conductors, between ends of the pair of the third magneto-resistance elements positioned outside the two second conductors, and between ends of the pair of the fourth magneto-resistance elements positioned outside the two second conductors; and a device which detects a first intermediate potential output from the connected ends of the pair of the first magneto-resistance elements and a second intermediate potential output from the connected ends of the pair of the second magneto-resistance elements to get a first potential output difference between the first intermediate potential output and the second intermediate potential output, and which detects a third intermediate potential output from the connected ends of the pair of the third magneto-resistance elements and a fourth intermediate potential output from the connected ends of the pair of the fourth magneto-resistance elements to get a second potential output difference between the third intermediate potential output and the fourth intermediate potential output, while the DC electric voltage for measurement is applied to each pair of the magneto-resistance elements, and the device measures a magnetic field direction from the first potential output difference and the second potential output difference.

4. A two-axis magnetic field sensor as set forth in claim 3, wherein conductors on hypotenuses of the two right triangle plane coils are disposed adjacent to each other.

5. A two-axis magnetic field sensor as set forth in claim 3, further including each of the magneto-resistance elements crosses its respective conductor in the longitudinal direction of each magneto-resistance element at an angle of 40 degrees or more and less than 70 degrees with respect to its respective conductor.

6. A two-axis magnetic field sensor comprising:

first and second rectangular plane coils having adjacent long sides such that the first and second rectangular plane coils form a square shape, each of the rectangular coils having a first conductor, a second conductor, and a third conductor, the first conductors of each rectangular coil being parallel with each other, and the second and third conductors of both plane coils being parallel with each other;

the first conductor of the first rectangular plane coil crosses a first one of a pair of first magneto-resistance elements and a second one of a pair of second magneto-resistance elements, the second conductor of the first rectangular plane coil crosses a second one of a pair of third magneto-resistance elements, and the third conductor of the first rectangular plane coil crosses a second one of a pair of fourth magneto-resistance elements, the first, second, and third conductors of the first rectangular plane coil constituting three sides of the first rectangular plane coil, the first and second conductors of the first rectangular plane coil being connected to a first DC power source, and the first conductor of the second rectangular plane coil crosses a second one of the pair of the first magneto-resistance elements and a first one of the pair of the second magneto-resistance elements, the third conductor of the second rectangular plane coil crosses a first one of the pair of the third magneto-resistance elements, and the second conductor of the second rectangular plane coil crosses a first one of the pair of the fourth magneto-resistance elements, the first, second, and third conductors of the second rectangular plane coil constituting three sides of the second rectangular plane coil, the first and second conductors of the second rectangular plane coil being connected to a second DC power source, and conductors on remaining sides of the first and second rectangular plane coils are disposed adjacent to each other;

on a plane adjacent to the rectangular plane coils and parallel to the rectangular plane coils, the pair of first magneto-resistance elements each having ends in a longitudinal direction, the first one of the pair of first magneto-resistance elements crossing only the first conductor of the first rectangular plane coil in the longitudinal direction of the first one of the pair of first magneto-resistance elements at an angle of 30 degrees or more and less than 90 degrees with respect to the first conductor of the first rectangular plane coil, and the second one of the pair of first magneto-resistance elements crossing only the first conductor of the second rectangular plane coil in the longitudinal direction of the second one of the pair of first magneto-resistance elements at an angle of 30 degrees or more and less than 90 degrees with respect to the first conductor of the second rectangular plane coil, the longitudinal directions of the pair of first magneto-resistance elements being not parallel to each other, and one end of each of the pair of first magneto-resistance elements being positioned inside the square shape formed by the first and second rectangular plane coils and connected to each other;

the pair of second magneto-resistance elements each having ends in a longitudinal direction, the first one of the pair of second magneto-resistance elements crossing only the first conductor of the second rectangular plane coil in the longitudinal direction of the first one of the pair of second magneto-resistance elements at an angle of 30 degrees or more and less than 90 degrees with respect to the first conductor of the second rectangular plane coil, and the second one of the pair of second magneto-resistance elements crossing only the first conductor of the first rectangular plane coil in the longitudinal direction of the second one of the pair of second magneto-resistance elements at an angle of 30 degrees or more and less than 90 degrees with respect to the first conductor of the first rectangular plane coil, the longitudinal directions of the pair of second magneto-resistance elements being not parallel to each other, and one end of each of the pair of second magneto-resistance elements being positioned inside the square shape formed by the first and second rectangular plane coils and connected to each other;

the pair of third magneto-resistance elements each having ends in a longitudinal direction, the first one of the pair of third magneto-resistance elements crossing only the third conductor of the second rectangular plane coil in the longitudinal direction of the first one of the pair of third magneto-resistance elements at an angle of 30 degrees or more and less than 90 degrees with respect to the third conductor of the second rectangular plane coil, and the second one of the pair of third magneto-resistance elements crossing only the second conductor of the first rectangular plane coil in the longitudinal direction of the second one of the pair of third magneto-resistance elements at an angle of 30 degrees or more and less than 90 degrees with respect to the second conductor of the first rectangular plane coil, the longitudinal directions of the pair of third magneto-resistance elements being not parallel to each other, and one end of each of the pair of third magneto-resistance elements being positioned inside the square shape formed by the first and second rectangular plane coils and connected to each other;

the pair of fourth magneto-resistance elements each having ends in a longitudinal direction, the first one of the pair of fourth magneto-resistance elements crossing only the second conductor of the second rectangular plane coil in the longitudinal direction of the first one of the pair of fourth magneto-resistance elements at an angle of 30 degrees or more and less than 90 degrees with respect to the second conductor of the second rectangular plane coil, and the second one of the pair of fourth magneto-resistance elements crossing only the third conductor of the first rectangular plane coil in the longitudinal direction of the second one of the pair of fourth magneto-resistance elements at an angle of 30 degrees or more and less than 90 degrees with respect to the third conductor of the first rectangular plane coil, the longitudinal directions of the pair of fourth magneto-resistance elements being not parallel to each other, and one end of each of the pair of fourth magneto-resistance elements being positioned inside the square shape formed by the first and second rectangular plane coils and connected to each other;

the first DC power source supplies a current flow through the first, second, and third conductors of the first rectangular plane coil so as to apply a magnetic field to saturate the two magneto-resistance elements crossing the first conductor of the first rectangular plane coil in a direction and to apply a magnetic field to saturate the magneto-resistance elements crossing each of the second and third conductors of the first rectangular plane coil in respective directions, the second DC power source supplies a current flow through the first, second, and third conductors of the second rectangular plane coil so as to apply a magnetic field to saturate the two magneto-resistance elements crossing the first conductor of the second rectangular plane coil in a direction opposite to the direction of the magnetic field saturating the two magneto-resistance elements crossing the first conductor of the first rectangular plane coil, and to apply a magnetic field to saturate the two magneto-resistance elements crossing the second and third conductors of the second rectangular plane coil in the respective directions of the second and third conductors of the first rectangular plane coil, the first DC power source supplies a current flow through the first conductor of the first rectangular plane coil so as to apply to the two magneto-resistance elements crossing the first conductor of the first rectangular plane coil, a total magnetic field including a certain amount of a biasing magnetic field in a direction opposite to the magnetic field applied to saturate the two magneto-resistance elements crossing the first conductor of the first rectangular plane coil plus a magnetic field canceling an external offset magnetic field applied to the two magneto-resistance elements crossing the first conductor of the first rectangular plane coil, the first DC power source also supplies a current flow through the second and third conductors of the first rectangular plane coil so as to apply, to the magneto-resistance elements crossing the second and third conductors of the first rectangular plane coil, a total magnetic field including a certain amount of a biasing magnetic field in a direction opposite to the magnetic field applied to saturate the magneto-resistance elements crossing the second and third conductors of the first rectangular plane coil plus a magnetic field canceling an external offset magnetic field applied to the magneto-resistance elements crossing the second and third conductors of the first rectangular plane coil, the second DC power source supplies a current flow through the first conductor of the second rectangular plane coil so as to apply, to the two magneto-resistance elements crossing the first conductor of the second rectangular plane coil, a total magnetic field including a certain amount of a biasing magnetic field in a direction opposite to the magnetic field applied to saturate the two magneto-resistance elements crossing the first conductor of the second rectangular plane coil plus a magnetic field canceling an external offset magnetic field applied to the two magneto-resistance elements crossing the first conductor of the second rectangular plane coil, the second DC power source also supplies a current flow through the second and third conductors of the second rectangular plane coil so as to apply, to the magneto-resistance elements crossing the second and third conductors of the second rectangular plane coil, a total magnetic field including a certain amount of a biasing magnetic field in a direction opposite to the magnetic field applied to saturate the magneto-resistance elements crossing second and third conductors of the second rectangular plane coil plus a magnetic field canceling an external offset magnetic field applied to the magneto-resistance elements crossing the second and third conductors of the second rectangular plane coil;

a measurement power source which applies a DC electric voltage for measurement: between ends of the pair of the first magneto-resistance elements positioned outside the square shape formed by the first and second rectangular plane coils, between ends of the pair of the second magneto-resistance elements positioned outside the square shape formed by the first and second rectangular plane coils, between ends of the pair of the third magneto-resistance elements positioned outside the square shape formed by the first and second rectangular plane coils, and between ends of the pair of the fourth magneto-resistance elements positioned outside the square shape formed by the first and second rectangular plane coils; and a device which detects a first intermediate potential output from the connected ends of the pair of the first magneto-resistance elements and a second intermediate potential output from the connected ends of the pair of the second magneto-resistance elements to get a first potential output difference between the first intermediate potential output and the second intermediate potential output, and which detects a third intermediate potential output from the connected ends of the pair of the third magneto-resistance elements and a fourth intermediate potential output from the connected ends of the pair of the fourth magneto-resistance elements to get a second potential output difference between the third intermediate potential output and the fourth intermediate potential output, white the DC electric voltage for measurement is applied to each pair of the magneto-resistance elements, and the device measures a magnetic field direction from the first potential output difference and the second potential output difference.

7. A two-axis magnetic field sensor as set forth in claim 6, further including each of the magneto-resistance elements crosses its respective conductor in the longitudinal direction of each magneto-resistance element at an angle of 40 degrees or more and less than 70 degrees with respect to its respective conductor.

* * * * *